US006798191B1

(12) United States Patent
Macfarlane et al.

(10) Patent No.: US 6,798,191 B1
(45) Date of Patent: Sep. 28, 2004

(54) REVENUE METER WITH A GRAPHIC USER INTERFACE BEING OPERATIVE TO DISPLAY SCALABLE OBJECTS

(75) Inventors: I. Ross Macfarlane, British Columbia (CA); Peter C. Cowan, British Columbia (CA); David W. Giles, British Columbia (CA); Markus F. Hirschbold, British Columbia (CA); Rene T. Jonker, British Columbia (CA)

(73) Assignee: Power Measurement Ltd., British Columbia (CA)

( * ) Notice: Subject to any disclaimer, the term of this patent is extended or adjusted under 35 U.S.C. 154(b) by 0 days.

(21) Appl. No.: 09/370,757

(22) Filed: Aug. 9, 1999

(51) Int. Cl.$^7$ ................................................. G01R 1/04
(52) U.S. Cl. ........................ 324/157; 324/156; 361/659; 361/681
(58) Field of Search ................................. 361/659, 672, 361/681, 664, 730; 340/870.02; 324/157, 156, 142, 116, 115, 110, 103 R; 439/876, 83; 327/74; 29/845; 702/60–62; 228/266

(56) References Cited

U.S. PATENT DOCUMENTS

| 4,077,061 A | 2/1978 | Johnston et al. |
|---|---|---|
| 4,156,280 A | 5/1979 | Griess |
| 4,240,149 A | 12/1980 | Fletcher et al. |
| 4,345,311 A | 8/1982 | Fielden |
| 4,365,302 A | 12/1982 | Elms |
| 4,388,611 A | 6/1983 | Haferd |
| 4,455,612 A | 6/1984 | Girgis et al. |
| 4,459,546 A | 7/1984 | Arrington et al. |
| 4,463,311 A | 7/1984 | Kobayashi |
| RE31,774 E | 12/1984 | Fletcher et al. |
| 4,568,934 A | 2/1986 | Allgood |
| 4,612,617 A | 9/1986 | Laplace, Jr. et al. |
| 4,642,564 A | 2/1987 | Hurley |

(List continued on next page.)

OTHER PUBLICATIONS

Quantum® Q1000 "Sandy Creek Plant Lonworks® Communication" brochure, ©Copyright 1997 Schlumberger Industries, Inc., MK/1662/9–97, pp. 1–4.
Schlumberger Electricity "One of your largest customers is concerned about power quality . . . " brochure, © Copyright 1996 Schlumberger Industries, Inc., PP1633/6–96m pp. 1–5.
Schlumberger "Quantum® Q100 Multimeasurement Meter Technical Reference Guide," Effective Oct. 1999, © Copyright 1999, Schlumberger Resource Management Services, Inc.

*Primary Examiner*—Jay Patidar
(74) *Attorney, Agent, or Firm*—Brinks Hofer Gilson & Lione

(57) ABSTRACT

A revenue meter includes electronics for measuring the delivery of electrical energy from an energy supplier to a consumer through an electric circuit. A meter cover encloses the revenue meter. A keypad is located on the meter cover, and connects to the revenue meter to access the revenue meter without requiring removal of the meter cover.

33 Claims, 21 Drawing Sheets

U.S. PATENT DOCUMENTS

| | | | |
|---|---|---|---|
| 4,663,587 A | | 5/1987 | Mackenzie |
| 4,672,555 A | | 6/1987 | Hart et al. |
| 4,715,000 A | | 12/1987 | Premerlani |
| 4,783,748 A | | 11/1988 | Swarztrauber et al. |
| 4,794,369 A | | 12/1988 | Haferd |
| 4,837,504 A | | 6/1989 | Baer et al. |
| 4,839,819 A | | 6/1989 | Begin et al. |
| 4,878,142 A | | 10/1989 | Bergman et al. |
| 4,878,185 A | | 10/1989 | Brand et al. |
| 4,884,021 A | | 11/1989 | Hammond et al. |
| 4,901,221 A | | 2/1990 | Kodosky et al. |
| 4,914,568 A | | 4/1990 | Kodosky et al. |
| 4,959,607 A | * | 9/1990 | Coryea et al. ............. 324/116 |
| 4,979,122 A | | 12/1990 | Davis et al. |
| 5,017,860 A | | 5/1991 | Germer et al. |
| 5,021,763 A | * | 6/1991 | Obear ....................... 340/407 |
| 5,059,896 A | | 10/1991 | Germer et al. |
| 5,061,890 A | | 10/1991 | Langini |
| 5,081,413 A | | 1/1992 | Yamada et al. |
| 5,122,735 A | | 6/1992 | Porter et al. |
| 5,132,610 A | | 7/1992 | Ying-chang |
| 5,151,866 A | | 9/1992 | Glaser et al. |
| 5,155,836 A | | 10/1992 | Jordan et al. |
| 5,212,441 A | | 5/1993 | McEachern et al. |
| 5,224,011 A | | 6/1993 | Yalla et al. |
| 5,224,054 A | | 6/1993 | Wallis |
| 5,233,538 A | | 8/1993 | Wallis |
| 5,243,536 A | | 9/1993 | Bradford |
| 5,243,537 A | | 9/1993 | Neumann |
| 5,245,275 A | | 9/1993 | Germer et al. |
| 5,247,454 A | | 9/1993 | Farrington et al. |
| 5,258,704 A | | 11/1993 | Germer et al. |
| 5,262,715 A | | 11/1993 | King et al. |
| 5,270,640 A | | 12/1993 | Kohler et al. |
| 5,301,121 A | | 4/1994 | Garverich et al. |
| 5,391,983 A | | 2/1995 | Lusignam et al. |
| 5,414,812 A | | 5/1995 | Filip et al. |
| 5,426,780 A | | 6/1995 | Gerull et al. |
| 5,481,700 A | | 1/1996 | Thuraisingham |
| 5,498,956 A | | 3/1996 | Kinney et al. |
| 5,514,953 A | | 5/1996 | Schultz et al. |
| 5,514,959 A | | 5/1996 | Horan et al. |
| 5,537,029 A | | 7/1996 | Hemminger et al. |
| 5,548,527 A | | 8/1996 | Hemminger et al. |
| 5,549,089 A | | 8/1996 | Snell et al. |
| 5,555,508 A | | 9/1996 | Munday et al. |
| 5,627,759 A | | 5/1997 | Bearden et al. |
| 5,631,843 A | | 5/1997 | Munday et al. |
| 5,650,936 A | | 7/1997 | Loucks et al. |
| 5,736,847 A | | 4/1998 | Van Doorn et al. |
| 5,745,114 A | * | 4/1998 | King et al. .................. 345/810 |
| 5,828,576 A | | 10/1998 | Loucks et al. |
| 5,861,742 A | | 1/1999 | Miller et al. |
| 6,049,791 A | * | 4/2000 | Lerner ........................ 324/142 |

OTHER PUBLICATIONS

"QUAD4® Plus and MAXsys™ Multifunction Electronic Meters and IEDS," On–Line User Guide, *QUAD4 Plus/MAXsys Products User's Guide*, Rev. 1.01, pp. 1–1—1–4; 1–13—1–15; 4–100, 4–107—4–108.

"QUAD4® Plus and MAXsys™ Multifunction Electronic Meters and IEDS", On–Line User Guide Product Definitions, *QUAD4 Plus/MAXsys Products User's Guide*, Rev. 1.01, pp. DEF–1—DEF–13.

"Protective Relaying Theory and Applications," edited by Walter A. Elmore, pp. 17–37 (1994).

"The world is changing. The old answers no longer apply," *Schlumberger*, Bulletin.

"Series PM170 Powermeters," *SATEC*, Bulletin.

"System 270 Powermeter," *SATEC*, Bulletin.

"RPM090 Digital Transducer," *SATEC*, Bulletin.

"Series 290 Power Monitoring System," *SATEC*, Bulletin.

"PM290HD Powermeter With Harmonic Analysis," *SATEC*, Bulletin.

"AX–7 Analog Expander," *SATEC*, Bulletin.

"Application Software, Professional Systems For Energy Control And Management," *SATEC*, Bulletin.

"Power Monitoring And Analysis Systems," *SATEC*, Bulletin.

"PM—295 Powermeter / Harmonic Analyzer," *SATEC*, Bulletin.

"PM 295 Power Monitoring System with Harmonic Analysis," *SATEC*, Bulletin.

"PM 170M Powermeter—with KVA Measurements," *SATEC*, Bulletin.

"Vector Electricity Meter with the Site Genie™ Monitor," *General Electric,*.

"VECTRON® SVX Solid–State Polyphase Meters," *Schlumberger*, Bulletin 11314 (Mar. 1996).

"MAXsys® 2510 Substation/High–End Direct Access Meter," *Siemens*, Bulletin.

"MAXsys® 2410 Direct Access Meter," *Siemens*, Bulletin.

"AIN ALPHA® Meter For IEC Standards," *ABB Information Systems*, Bulletin.

"ALPHA Stars™, National Wireless Communications for Remote Metering," *ABB Information Systems*, Bulletin.

"AIN Alpha, High Function Multi–Tariff Solid State Electricity Meter," *ABB Network Partner*, PB 42–280–lb, pp. 1–20.

"MARK–V Digital True RMS Energy Meter," *TransData, Inc.*, Bulletin.

"MAXsys®—PSI," *Siemens*, Bulletin.

"MeterView™ Software Environment . . . , . . . Instant Access to Maxsys™ Meter Information," *Siemens*, D00024D (1997).

"MAXsys®—Multi–Access Metering And Control," *Siemens*, Bulletin.

"MAXsys® For Energy Providers," *Siemens*, Bulletin.

QUAD4® Plus and MAXsys® Meters and IEDs, *Siemens, QUAD2DSQ* (1998).

The QUAD4® Plus Solid–State Meter, *PSI*, Bulletin.

"kV Telephone Modem," *General Electric*, Bulletin.

"kV A–Base Meters," *General Electric*, Bulletin.

"kV Class 320 Meters," *General Electric*, Bulletin.

"EnergyAxis™ Customer Site Metering System For On–Site Metering and Power Analysis,", *ABB Information Systems*, Bulletin (1998).

"8500 ION® Direct Access Billing Meter," *8500 ION™*, Power Measurement, Bulletin (Aug. 11, 1998).

"7700 ION® 3–Phase Power Meter, Analyzer and Controller," *7700 ION™*, Power Measurement, Bulletin (Apr. 22, 1998).

"American National Standard for Electric Meters—Code for Electricity Metering," *American National Standard*, Document ANSI C12.1 (1995).

"American National Standard for Electromechanical Watthour Meters," *The Institute of Electrical and Electronics Engineers, Inc.*, ANSI C12 (1987) (Revision of ANSI C12–10–1987).

"American National Standard for Electronic Time–of–Use Registers for Electricity Meters," *The Institute of Electrical and Electronics Engineers, Inc.,* ANSI C12 (Revision of ANSI C12 13–1985) (1991).

"American National Standard for Solid–State Electricity Meters," *The Institute of Electrical and Electronics Engineers, Inc.,* ANSI C12.16 (1991).

"American National Standard for Electricity Meters 0.2 and 0.5 Accuracy Classes," *American National Standards,* ANSI C12.20 (1998).

"ISO—Specification MTR1–96, Engineering Specification For Polyphase Solid–State Electricity Meters For Use On The ISO Grid," Exhibit A, pp. 1–42 (1997).

"Specifications For Approval Of Type of Electricity Meters, Instrument Transformers And Auxiliary Devices," *Consumer and Corporate Affairs Canada.*

International Standard, Alternating current static watt–hour meters for active energy (classes 0,2 S and 0,5 S), *International Electrotechnical Commission,* second edition (1992).

"Meter–Mounting Devices, Industrial Products," *Canadian Standards Association,* C22.2 No. 115–M (1989).

"Alternating–Current Electricity Metering, Electric Power Systems and Equipment," *Canadian Standards Association,* CAN3–C17–M (1984).

International Standard, Amendment 1 to Publication 868 (1986), *International Electrotechnical Commission,* Modification 1 (1986).

"International Standard, Electromagnetic Compatibility (EMC)—Part 4: Testing and measurement techniques—Section 15: Flickermeter—Functional and design specifications," *International Electrotechnical Commission,* 61000 4–15 (1997).

"Measurement Guide for Voltage Characteristics—Electricity Product Characteristics and Electromagnetic Compatibility," 230.02 *Norcomp, Unipede* (1995).

"Voltage characteristics of electricity supplied by public distribution systems," *BSI Standards,* 50160 (1995).

"Minutes of the 7th Meeting, Distribution Committee," *EEI,* 1998.

Brochure for the Quantum Q1000, Schlumberger, 6 pages (1997).

*GE kV2™ Malfunction Meter,* Product Description, Operating Instructions, Maintenance Instructions, Upgrading, Site Analysis Guides, Diagrams, pp. 1–1–2–32, Dec. 2000.

* cited by examiner

REVENUE METER WITH A GRAPHIC USER INTERFACE BEING OPERATIVE TO DISPLAY SCALABLE OBJECTS

CROSS REFERENCE TO RELATED APPLICATIONS

The following co-pending and commonly assigned U.S. patent applications have been filed on the same date as the present application. All of these applications relate to and further describe other aspects of the embodiments disclosed in the present application and are all herein incorporated by reference.

U.S. patent application Ser. No. 09/370,317, "REVENUE METER WITH POWER QUALITY FEATURES", filed Aug. 9, 1999.

U.S. patent application Ser. No. 09/371,883, "A-BASE REVENUE METER WITH POWER QUALITY FEATURES", filed Aug. 9, 1999.

U.S. patent application Ser. No. 09/370,695, "REVENUE METER WITH GRAPHIC USER INTERFACE", filed Aug. 9, 1999.

U.S. patent application Ser. No. 09/370,686, "REVENUE METER BLADE ASSEMBLY AND METHOD OF ATTACHMENT", filed Aug. 9, 1999, and issued as U.S. Pat. No. 6,186,842 on Feb. 13, 2001.

U.S. patent application Ser. No. 09/370,863, "A POWER SYSTEM TIME SYNCHRONIZATION DEVICE AND METHOD FOR SEQUENCE OF EVENT RECORDING", filed Aug. 9, 1999.

U.S. patent application Ser. No. 09/369,870, "METHOD AND APPARATUS FOR AUTOMATICALLY CONTROLLED GAIN SWITCHING OF POWER MONITORS", filed Aug. 9, 1999.

U.S. patent application Ser. No. 09/370,696, "EXTERNAL I/O AND COMMUNICATIONS INTERFACE FOR A REVENUE METER", filed Aug. 9, 1999.

REFERENCE TO MICROFICHE APPENDIX

A microfiche appendix, Appendix A, is included of a computer program listing. The total number of microfiche is 6. The total number of frames is 186. A second microfiche appendix, Appendix B, is also included of schematic diagrams. The total number of microfiche is 1 and the total number of frames is 23.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

Generally, this invention relates to revenue meters of the type used by energy suppliers to accurately measure electrical energy delivered to consumers. More particularly, this invention relates to improved interfacing of the revenue meters.

BACKGROUND OF THE INVENTION

In a typical electrical distribution system, an electrical supplier or utility company generates electrical energy and distributes the electrical energy to consumers via a power distribution network. The power distribution network is the network of electrical distribution wires which link the electrical supplier to its consumers. At the consumer's facility, there will typically be an electrical energy meter (revenue meter) connected between the consumer and the power distribution network to measure the consumer's electrical demand. The revenue meter is an electrical energy measurement device which accurately measures the amount of electrical energy flowing to the consumer from the supplier. The amount of electrical energy measured by the meter is then used to determine the amount required to compensate the energy supplier.

To provide user input to the revenue meter, known meters typically utilize cumbersome keys or buttons located within a sealed cover of the revenue meter, or keys which are accessible from the outside but are sealed and cannot be activated without removing the seal. In both cases, at least one security seal is installed to prevent or indicate unauthorized access. Thus, the seal must be replaced every time the meter is accessed.

A problem exists when keys are added to the cover to access the revenue meter since tolerances in both the manufactured parts and the assembly process can cause an internal structure of the assembled revenue meter to misalign with the cover, for example, lean and twist with relation to the cover. Yet, it is important to line up the keys on the cover with the appropriate buttons on the revenue meter.

Another problem stems from the fact that typical socket based revenue electricity meters provide Input and Output (I/O) ports. These ports can be analog or digital, inputs or outputs. Analog inputs are capable of measuring a 4–20 mA input signal which may indicate, for example, temperature from an external transducer. Moreover, analog outputs typically generate 4–20 mA outputs that indicate, for example, power being measured by the meter. Digital inputs typically connect to external contacts which may indicate, for example, the position of a switch in the substation. Moreover, digital outputs may be solid state relays capable of switching small loads on and off.

Known revenue meters typically use two methods of obtaining the I/O signals for the I/O from the revenue meter. The first method utilizes individual wires for each I/O port. The second method uses an industry standard communications protocol over, for instance, twisted pair communications wiring to communicate with an external third party device which provides the I/O ports.

On the one hand, since ANSI standard revenue metering sockets were not designed with I/O in mind, bringing I/O ports out of the meter on individual wires presents numerous problems. First, no provision exists for rendering the ports on terminals since the standard socket does not provide any. Therefore, the ports must exit the meter on individual wires. All signals, except voltage and current, must exit through a small port on the back of the socket. The amount of space available for this port is limited, therefore the number and size of wires that can exit the device is limited. Yet, known revenue meters may be required to provide a bundle of cables with a large amount of conductors to accommodate I/O and communication signals.

In addition, since the I/O circuitry is located inside the revenue meter, the revenue meter's size must increase to accommodate the circuitry. Additionally, the revenue meter must dissipate the additional heat generated by the I/O circuitry. Moreover, when an installer installs the device, they are faced with sorting out a large bundle of wires, typically by color coding, which is prone to error. The bundle of conductors are cumbersome to handle, and the area to access and connect the conductors is often limited. Finally, the I/O signal wires must be extended and routed to devices that may be located a great distance away from where the revenue meter is mounted.

On the other hand, using an industry standard communications protocol to communicate from the meter to an external I/O device solves many of the problems that accompany the internal I/O, but creates additional problems. Known standard communications interfaces typically do not provide a way to timestamp the absolute time that the input state was recorded, which is an important feature to various functions of the revenue meter. Even when this capability is provided, there is typically no way to ensure that the absolute time reference of the external I/O device and the revenue meter are the same. In addition, standard communications interfaces are typically bus architectures. Therefore, transferring I/O information from the external I/O device to and from the meter may be delayed by other devices using the bus. Also, known external I/O devices are often complicated to configure. In addition, standard external I/O devices must have dedicated power supplies which means additional wiring must be installed.

Thus, there is a need for an improved revenue meter that provides easily accessible and easy to use interfaces. This includes both a front panel, as well as I/O and communications connections. In addition, there is a need for an improved revenue meter with an I/O and communications interface that is located separate from the revenue meter. In addition, there is a need for an external I/O device that is easy for the user to configure, hence reducing installation time. Moreover, there is a need for an I/O and communications interface that is expandable and not limited to the number of conductors leaving the revenue meter.

SUMMARY OF THE INVENTION

Such needs are met or exceeded by the present interfaces for a revenue meter. In general, the revenue meter of the present invention provides easily accessible and easy to use interfaces that include a front panel keypad and I/O and communications connections. The keypad allows a user to interact with the meter without requiring a breach to a security seal. Moreover, the external I/O and communication interface is expandable and allows easy connection to and detachment from the revenue meter.

More specifically, the preferred embodiment of the present invention revenue meter includes electronics for measuring the delivery of electrical energy from an energy supplier to a consumer through an electric circuit. A meter cover encloses the revenue meter. A keypad is located on the meter cover, and connects to the revenue meter to access the revenue meter without requiring removal of the meter cover.

BRIEF DESCRIPTION OF THE DRAWINGS

Other features and advantages of the invention will be apparent to those skilled in the art with reference to the detailed description and the drawings, of which.

DETAILED DESCRIPTION OF THE INVENTION

The revenue meter of the present invention provides easily accessible and easy to use interfaces that include a front panel keypad, and I/O and communications connections. The keypad allows a user to interact with the meter without requiring a breach to a security seal. For example, the user may need to access a central processing unit (CPU) of the revenue meter to program the meter, to retrieve revenue data, and to retrieve power quality data. In addition, the interface provides an external I/O and communication interface that is expandable and not limited to the number of conductors leaving the revenue meter. Moreover, connection to, and detachment from, the interface is simplified through the use of a single cable protruding from the revenue meter to create the connection.

Revenue meters must comply with American National Standards Institute's (ANSI) Standards for electric meters which include, but are not limited to, the following:

ANSI C12.1 (1995): American National Standard for Electric Meters-Code for Electricity Metering ANSI C12.10 (1987): American National Standard for Electromechanical Watthour Meters ANSI C12.13 (1991): American National Standard for Electronic Time of Use Registers for Electricity Meters ANSI C12.16 (1991): American National Standard for Solid-State Electricity Meters ANSI C12.20 (1998): American National Standard for Electricity Meters 0.2 and 0.5 Accuracy Classes All of which are known in the art and are herein incorporated by reference.

Other specification/standards which apply to revenue meters include ISO Specification MTR1-96, "Engineering Specification for Polyphase Solid State Electricity Meters for Use on the ISO Grid," herein incorporated by reference.

Figure 1:
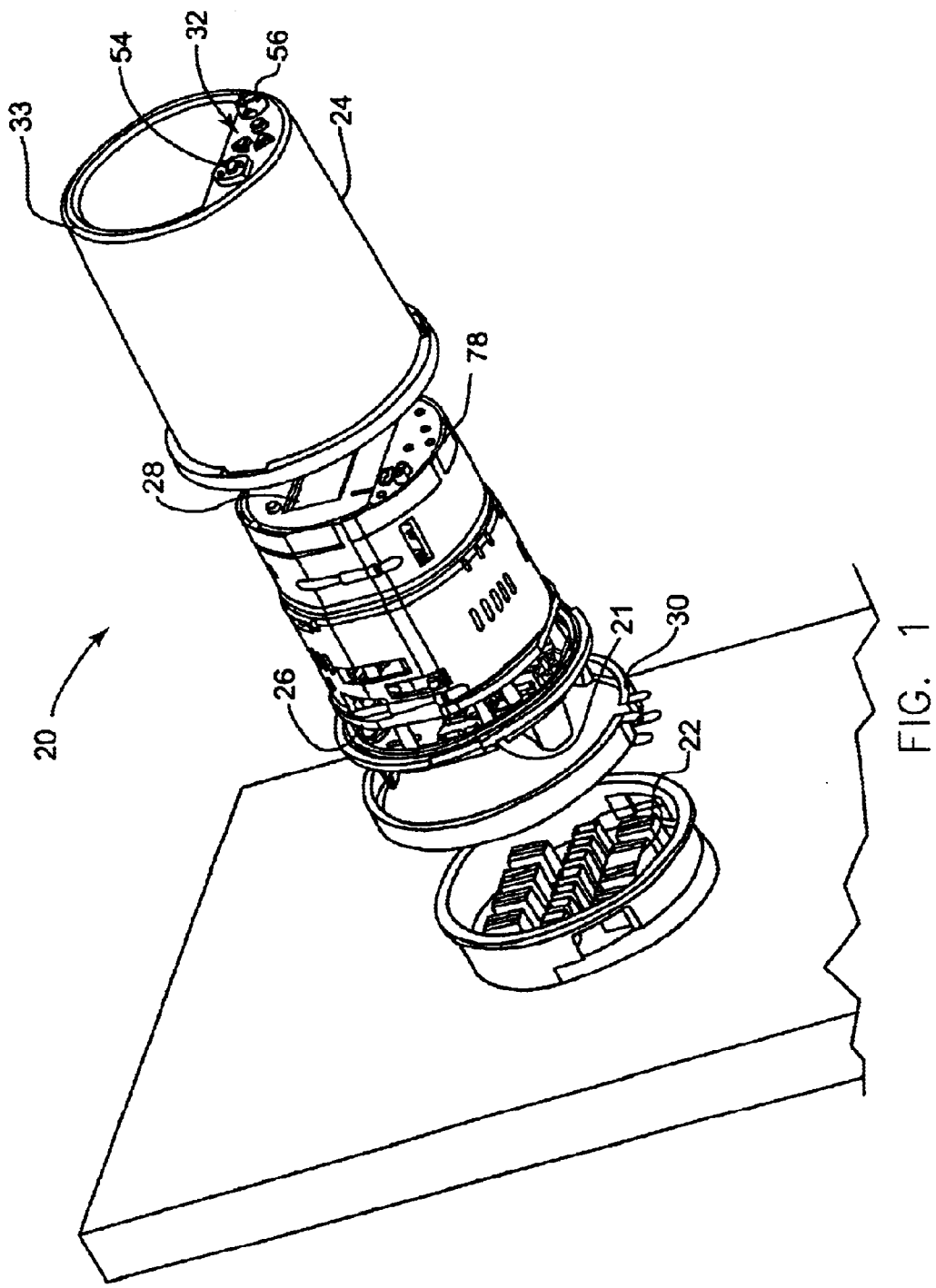
FIG. 1 depicts a perspective view of an exemplary S-Base revenue meter, and meter cover, which includes the interfaces of the present invention.
Figure 2:
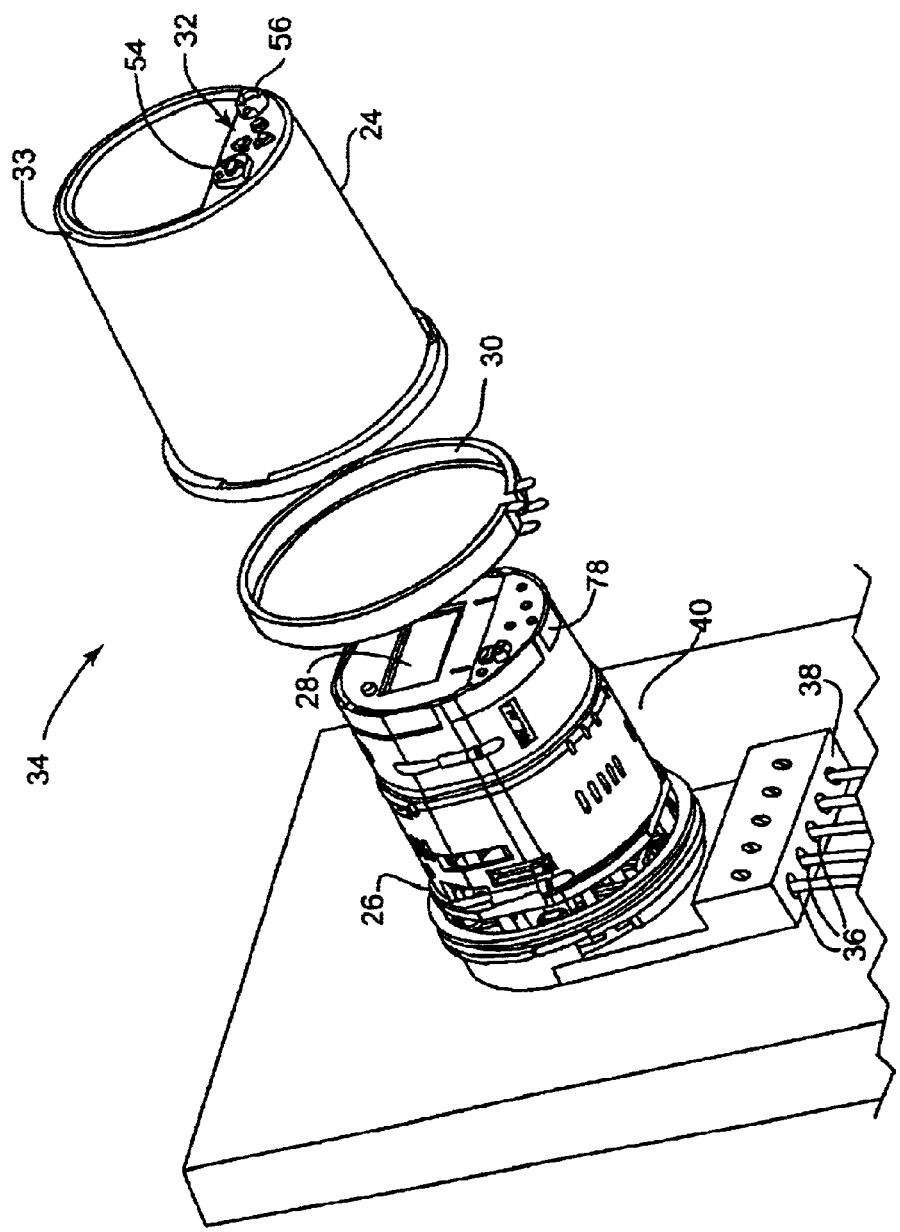
FIG. 2 depicts a perspective view of an exemplary A-Base revenue meter, and meter cover, which includes the interfaces of the present invention.
Figure 3:
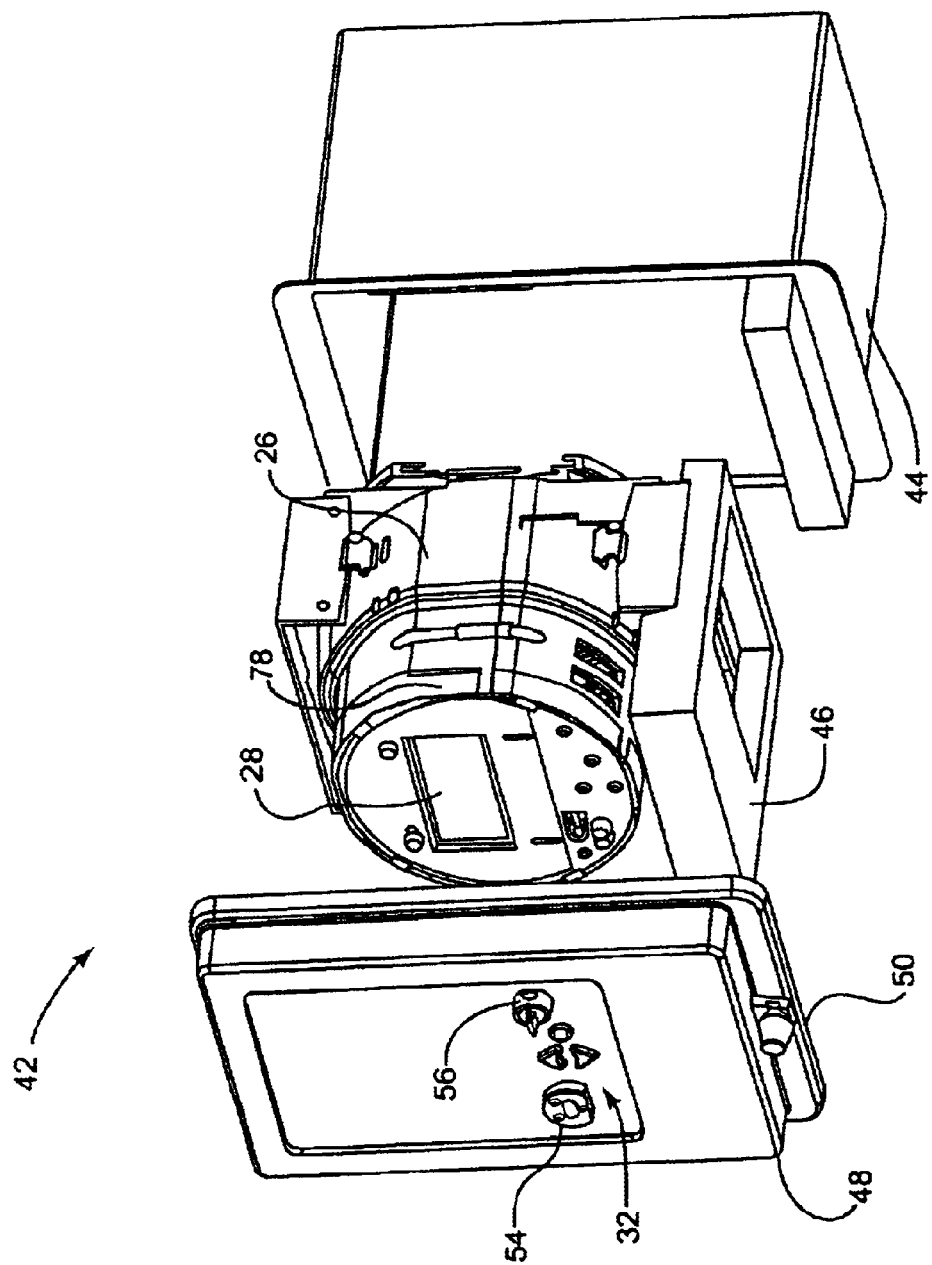
FIG. 3 depicts a perspective view of an exemplary Switchboard revenue meter, and meter cover, which includes the interfaces of the present invention.

Referring to the drawings, and particularly FIG. 1–3, the ANSI standards define two general types of revenue meters, socket based ("S-base" or "Type S") (shown in FIG. 1) and bottom connected ("A-base" or "Type A") (shown in FIG. 2). A third type of revenue meter, known as a "Switchboard Meter" or "Draw-out Meter", is also commonly used in the industry (shown in FIG. 3). These types of revenue meters are distinguished, in at least one respect, by the method in which they are connected with the electric circuit that they are monitoring. Herein, the phrase "connected with" is defined to mean directly coupled with or indirectly coupled to through one or more intermediate components.

Referring to FIG. 1 the S-base revenue meter is shown, designated generally as 20. An exemplary S-base revenue meter is the 8500 ION Revenue Meter manufactured by Power Measurement Limited, Saanichton, British Columbia, Canada. S-base meters feature blade type terminals (not shown) disposed on a base 21 of the meter. These blade terminals are designed to mate with matching jaws of a detachable meter mounting device such as a revenue meter socket 22. The socket 22 is hard wired to an electrical circuit (not shown) and is not meant to be removed. An exemplary meter socket is the 3000 Series manufactured by Meter Devices Co., Inc., Canton, Ohio.

S-base meters include a cover 24 which encloses the meter's electronics 26 and display 28. A sealing mechanism 30 secures the cover 24 to prevent unauthorized access to the meter electronics 26. Removal of the meter necessitates disengaging a t-seal (not shown) that seals the cover 24 and the revenue meter 20, which would indicate unauthorized tampering. A context adaptable input device, such as a keypad 32, is provided on a top portion 33 of the cover to allow access to the meter's electronics without requiring removal of the cover 24, described below.

Referring to FIG. 2, an A-base revenue meter is shown, designated generally as 34. The A-base meter 34 features bottom connected terminals 36 on the bottom side 38 of the meter. The terminals 36 are typically screw terminals for receiving the conductors of the electric circuit. A-base meters 34 are directly connected to the electric circuit and can only be installed or removed by connecting or disconnecting the conductors of the electric circuit. Typically, this means tightening or loosening each terminal 36 to secure or free the end of the conductor. A-base meters 34 utilize cover 24 to enclose the meter electronics and the display. As described with regard to the S-base revenue meter 20, the A-base meter typically utilizes a t-seal to prevent unauthorized tampering with the meter electronics 26. For the purposes of this disclosure, A-base meters also include S-base meters in combination with A-base adapters 40. An exemplary A-base adapter is the Polyphase Transformer Rated A to S Adapter manufactured by Ekstrom Industries, Incorporated, Farmington Hills, Mich.

Referring to FIG. 3, there is shown a Switchboard Meter, designated generally as 42. The Switchboard meter 42 consists of a switchboard enclosure 44 which is physically mounted and connected with the electrical circuitry. Exemplary enclosures are the ABB FT-21 and ABB-FT-32 manufactured by ABB, Raleigh, N.C. The switchboard meter 42, which includes the meter electronics 26 and display 28, is mounted on a draw-out chassis 46 which is removable from the switchboard enclosure 44. The draw-out chassis 46 interconnects the meter electronics 26 with the electrical circuit. The enclosure 44 also has a cover 48 which completely seals the meter inside the enclosure. The cover 48 includes the keypad 32 or input device for accessing the meter's electronics 26. The cover 48 has a sealing mechanism 50 which prevents removal of the cover 48 and indicates when the cover 48 has been tampered with.

Figure 4A:
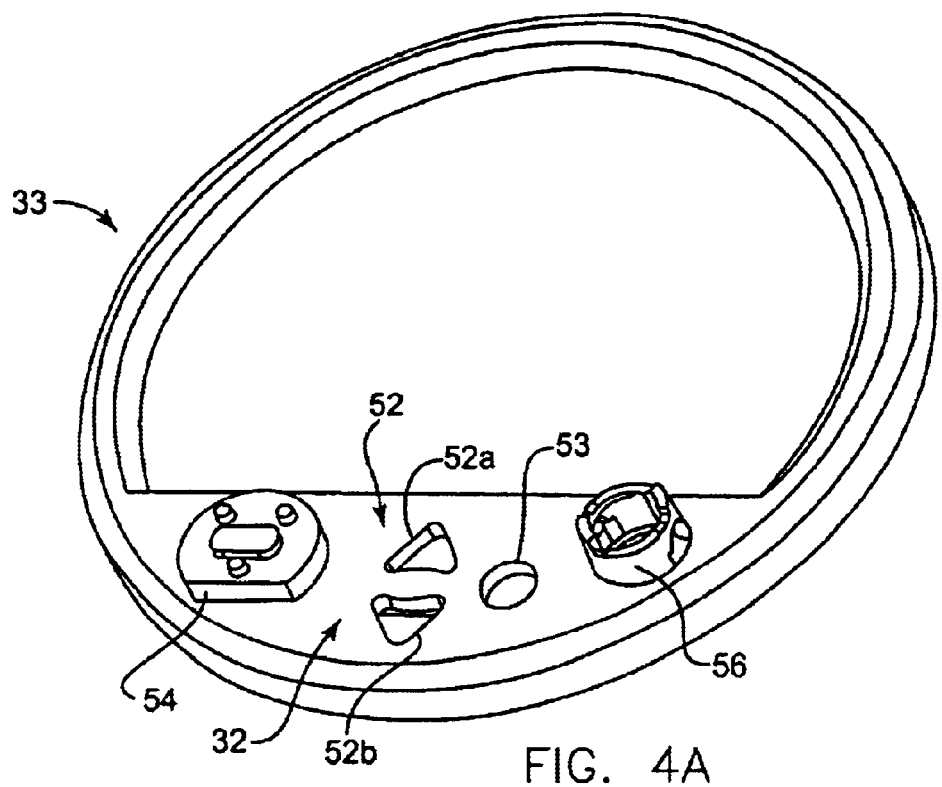
FIG. 4A shows a front side perspective view of an upper portion of the meter cover for an S-base and A-base revenue meters shown in FIGS. 1 and 2, including receptacles for a keypad according to the present invention.
Figure 4B:
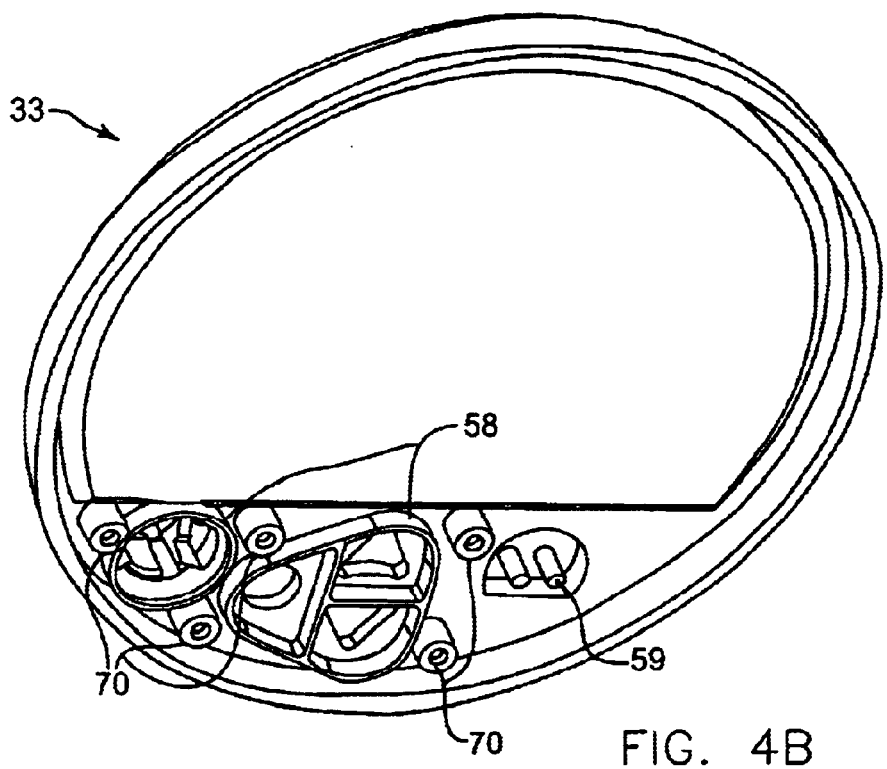
FIG. 4B depicts a backside perspective view of the upper portion of the meter cover for an S-base and A-base revenue meter according to FIG. 4A.
Figure 5A:
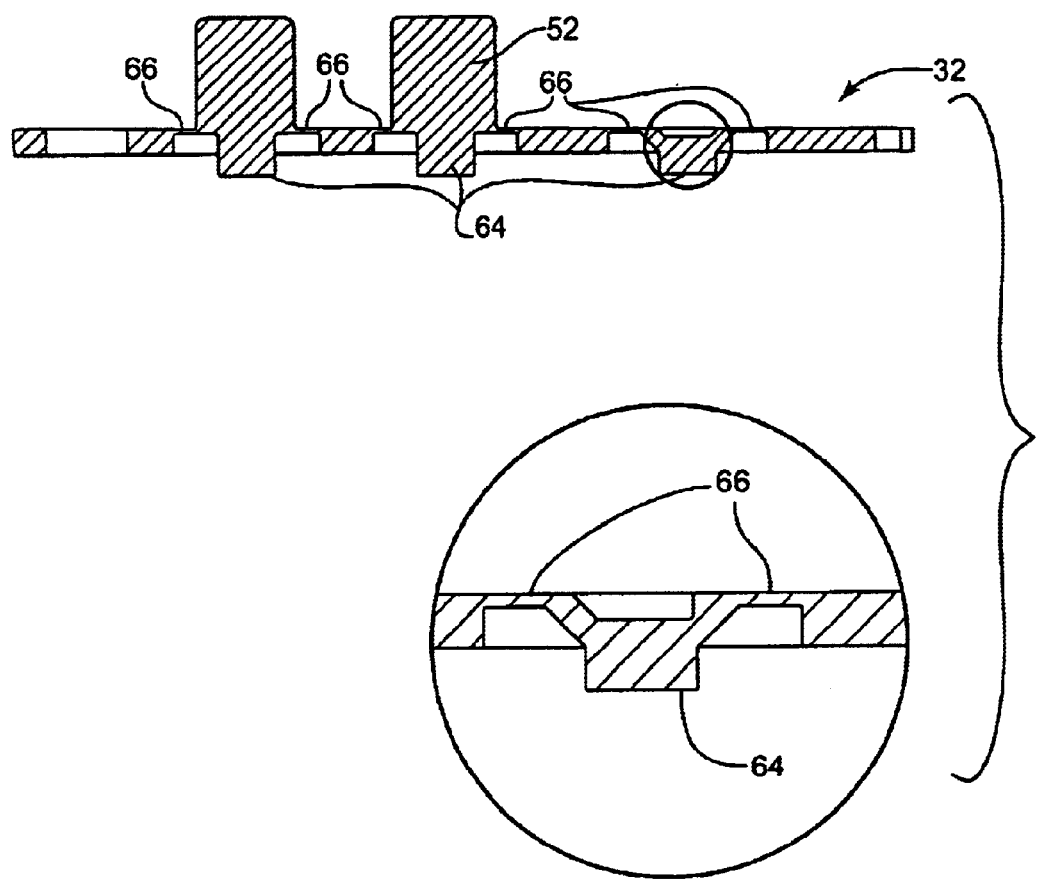
FIG. 5A depicts a cross-sectional view of an exemplary elastomer keypad according to a preferred embodiment of the present invention.
Figure 5B:
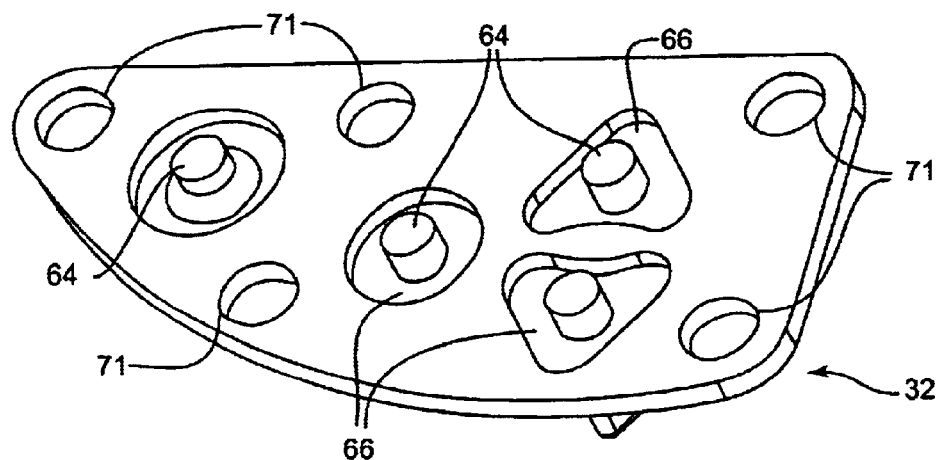
FIG. 5B shows a bottom perspective view of the elastomer keypad depicted in FIG. 5A.
Figure 5C:
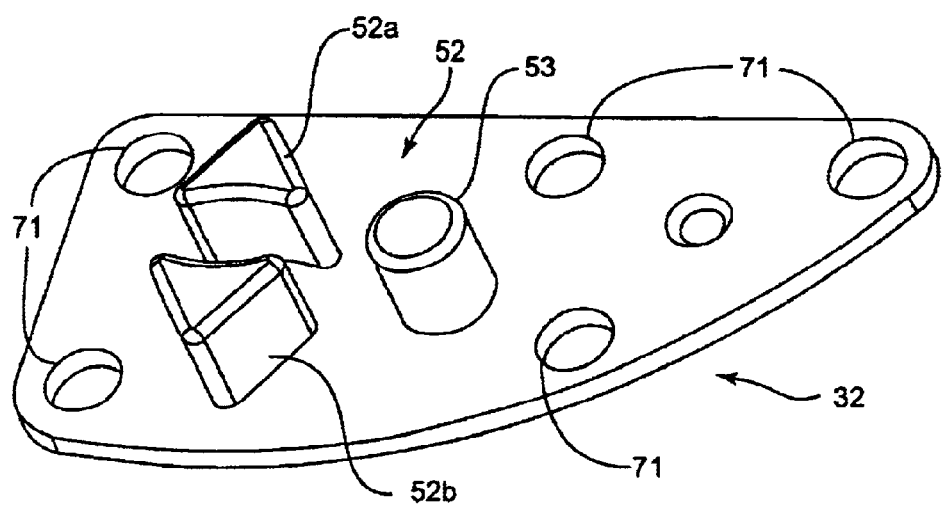
FIG. 5C depicts a top perspective view of the elastomer keypad shown in FIG. 5A.

Referring to FIGS. 1–3, the S-base and A-base revenue meters' cover 24, and the Switchboard revenue meter's cover 48, are at least partially transparent. The transparency permits viewing of the meter's display 28 including a graphic user interface (GUI) 199 (FIG. 11) without having to remove the cover 24. As mentioned above, the meter cover 24 provides the context adaptable input device such as the keypad 32 for interacting with the revenue meter while the meter cover 24, 48 remains in place. Artisans will appreciate that the keypad 32 can be replaced with other context adaptable input devices, such as a touch screen 1100, a mouse 1110, a track ball 1120, a light pen 1130, a membrane switch 1140, joystick 1150, dial 1160, or other similar Referring also to FIG. 4A, the top portion 33 of the cover preferably includes openings to accommodate scroll buttons 52 and an enter button 53 of the keypad 32. In addition, the top portion 33 of the cover includes an infrared locating member 54 which allows optical couplers (not shown) to access infrared emitters (not shown). Moreover, the top portion 33 of the cover provides a reset demand key wall 56 to sealingly accommodate a known reset demand key of the revenue meter. The top portion 33 also provides water proofing keypad sealing walls 58.

The keypad 32 presents information (i.e., the state of the input hardware such as buttons) or messages to a microprocessor, microcontroller or other central control device via the GUI, which in turn performs actions depending on the type of input and the current operating mode of the revenue meter 20, 34, 42. The GUI and a description of the operating modes is discussed in commonly owned U.S. patent application Ser. No. 09/370,695, "REVENUE METER WITH GRAPHIC USER INTERFACE" which was incorporated by reference above.

In a preferred embodiment the keypad 32 includes an up arrow button 52a a down arrow button 52b and the enter button 53. It will be recognized by those skilled in the art that other suitable buttons may be used. For example, the invention may be implemented using left and right arrow keys, other key arrangements as well as programmable soft keys. The revenue meter 20, 34, 42 is configured to normally scroll through predefined parameters on the screen 28. In one embodiment, to temporarily freeze the automatic scrolling of the display, the user presses either of the arrow buttons 52a, 52b. The user may then manually scroll through the display by using the buttons 52a and 52b. The enter button 53 may be used to toggle between various available modes of the revenue meter 20, 34, 42. The modes may include, for example, two display modes—a Norm mode and an Alt mode. The enter button 53 may also be used to view a setup menu.

In addition, the GUI is programmable to allow the revenue meter 20, 34, 42 to be customized via the keypad 32 to a particular application, presenting the user only with information required by the user. The GUI can be programmed using the keypad 32, or other suitable input device, or through one of the communication ports, described below.

In addition, the user may also use the keypad 32 or other suitable input device to navigate through a hierarchic menu system for meter configuration or GUI 199 customization. In the preferred embodiment, the meter 20, 34, 42 is provided with a default set of display screens and hierarchic interface menus, which can be re-programmed through the user interface itself or through the communications ports. The information to be displayed on the display screen, consists of graphical objects such as scalable text 198, lines 197, circles 196, rectangles 195, charts 194, etc. For each screen, a template is provided which in turn provides information on how the screen is laid out. Preferably, the template provides information on the appearance and location of the graphical objects.

The hierarchic menu system is activated by some input key combination, for example by holding the enter button 53 for an extended period of time. The hierarchic menu system can be implemented using a scrollable menu system with a simple up key 52a, down key 52b and enter button 53, i.e. the three-key interface used to navigate a set of menu choices. The up/down buttons 52a, 52b select the previous/next items in a list. The list is shown as a text list with the current item in the list highlighted in some fashion, either by inverting or changing the colors in some way or surrounding the highlighted item using a rectangle. When the enter input is activated using the enter button 53, the highlighted input is selected and the appropriate function is performed: either a new menu list is selected, a single item is selected (such as yes/no) or the user is presented with a changeable parameter. If the parameter is numeric, the up and down keys 52a, 52b will increment it. If the parameter has numerous numeric fields, holding the up or down arrow buttons 52a, 52b will activate the next/previous numeric field. Just pressing the up/down buttons 52a, 52b will then once again increment/decrement the numeric entry. Hitting the enter button 53 will accept the input value and perform the appropriate action, such as checking/asking for the password and/or confirmation.

Preferably, when the revenue meter 20, 34, 42 is in display mode, the up/down buttons 52a, 52b select either the next or previous display screen in a programmable list of display screens. If no direct user input is provided, the meter will automatically proceed to the next display screen after a preset programmable interval.

Other user interface functions can be implemented using various different combinations of the inputs. For example, the contrast change mode can be activated by simultaneously activating the up/down arrow keys 52a, 52b.

Referring to FIGS. 4B and 5A–5C, to provide a watertight interface between the keypad 32 and the cover 24, a backside of the top portion 33 of the cover 24 includes sealing walls 58. Infrared light pipes 59 are also included on the backside of the top portion 33 of the cover 24. As described, the keypad 32 of the revenue meter 20, 34, 42 utilizes an elastomer keypad. The sealing walls 58 sealingly engage the elastomer keypad 32. The keypad 32 includes at least one button, e.g., scroll buttons 52, with a plunger 64, and a web 66 portion which allows the plunger to move in a direction generally perpendicular to the keypad 32.

To protectively seal the revenue meter 20, 34, 42 from outside elements, such as rain, a compression plate 68 compresses the elastomer keypad 32 to the sealing walls 58. The compression plate 68 preferably is screwed to the cover 24 via bosses 70. It can be appreciated, however, that other fasteners, such as rivets and snap features within the plastic, can be used to attach the compression plate 68 to the cover 24. The sealing walls 58 and the compression plate 68 compress the keypad 32 to form a seal around each key 52 on the keypad 32. The sealing bosses 70 pass through corresponding holes 71 in the keypad 32 (seen best in FIGS. 5B and 5C) to be in direct contact with the compression plate 68. Thus, a seal that meets ANSI specifications is formed between the keypad 32 and the sealing walls 58. It can be appreciated that the keypad can be replaced with a weather proof touch screen or a membrane switch mounted on the cover to eliminate the need for sealing ribs and a compression plate. It can also be appreciated that the keypad can be welded or molded directly into the cover to eliminate the need for a compression plate.

Figure 6A:
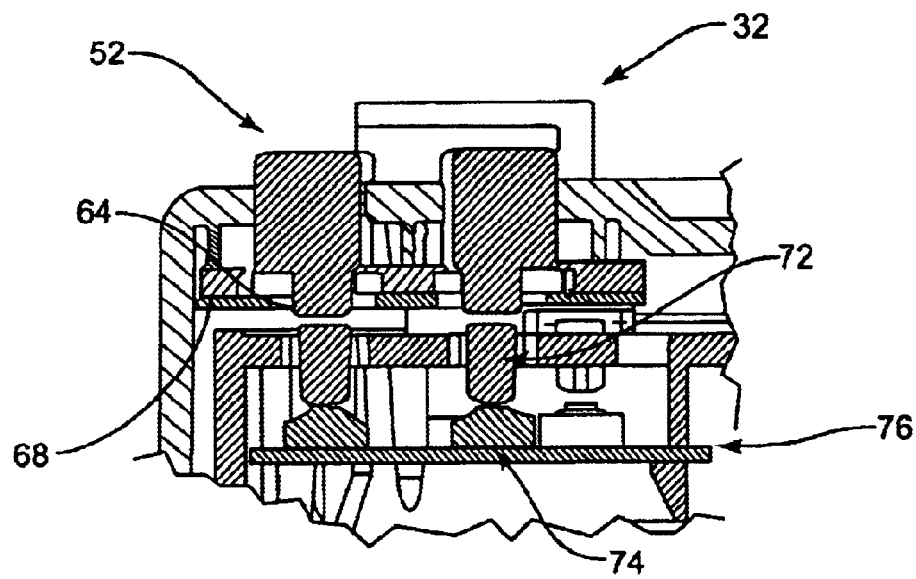
FIG. 6A shows a partial cross-sectional view of the scroll button mechanism according to a preferred embodiment of the present invention.
Figure 6B:
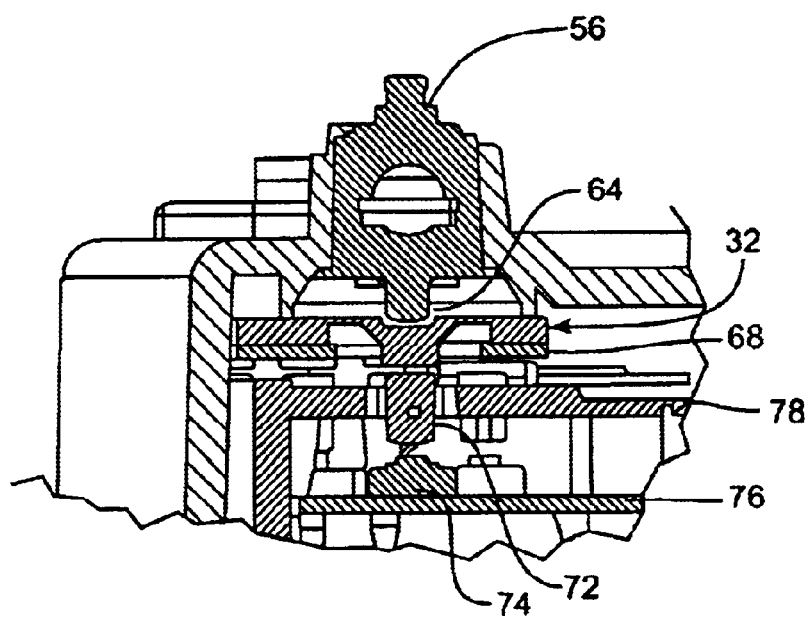
FIG. 6B shows a partial cross-sectional view of a demand reset key button mechanism according to a preferred embodiment of the present invention.
Figure 7A:
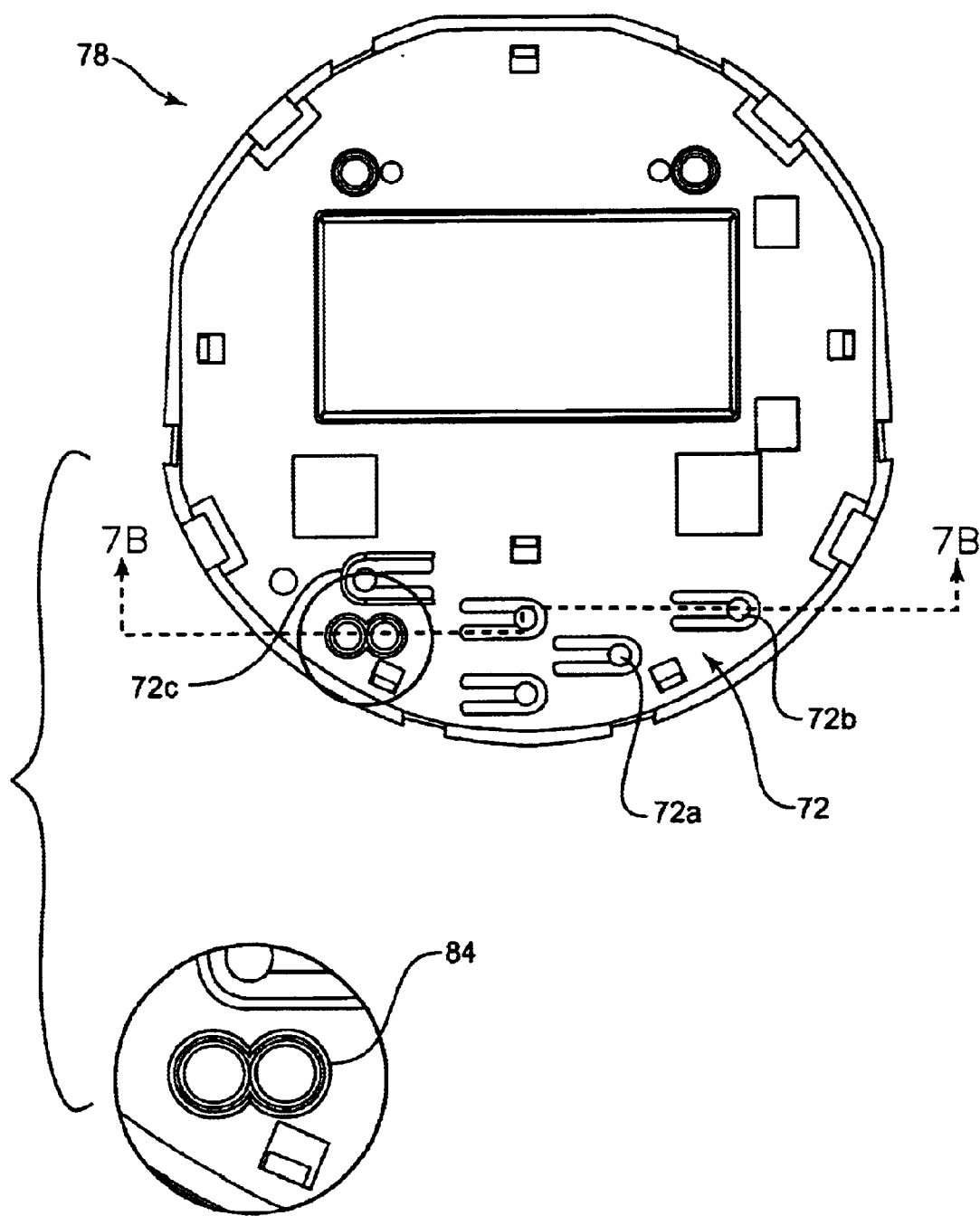
FIG. 7A shows a top view of a bezel according to a preferred embodiment of the present invention.
Figure 7B:
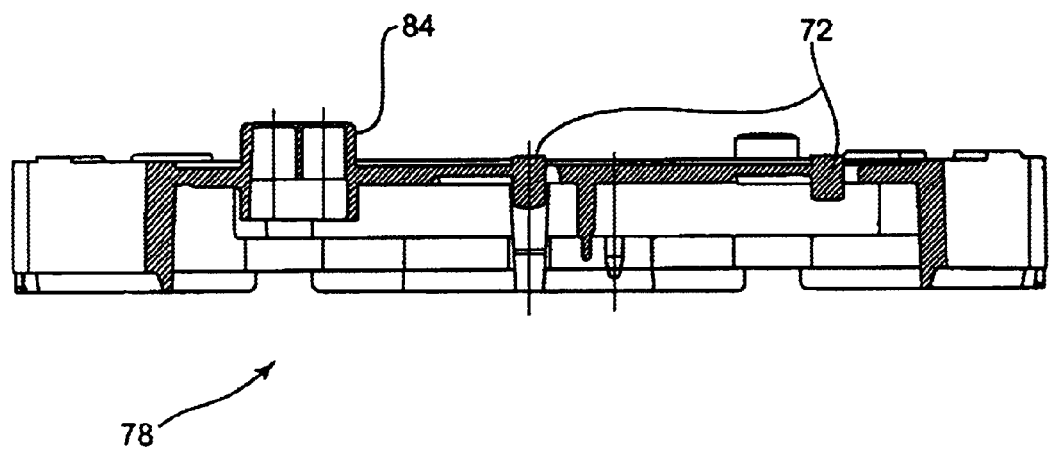
FIG. 7B depicts a cross-sectional view along line 7B—7B of the bezel shown in FIG. 7A.
Figure 7C:
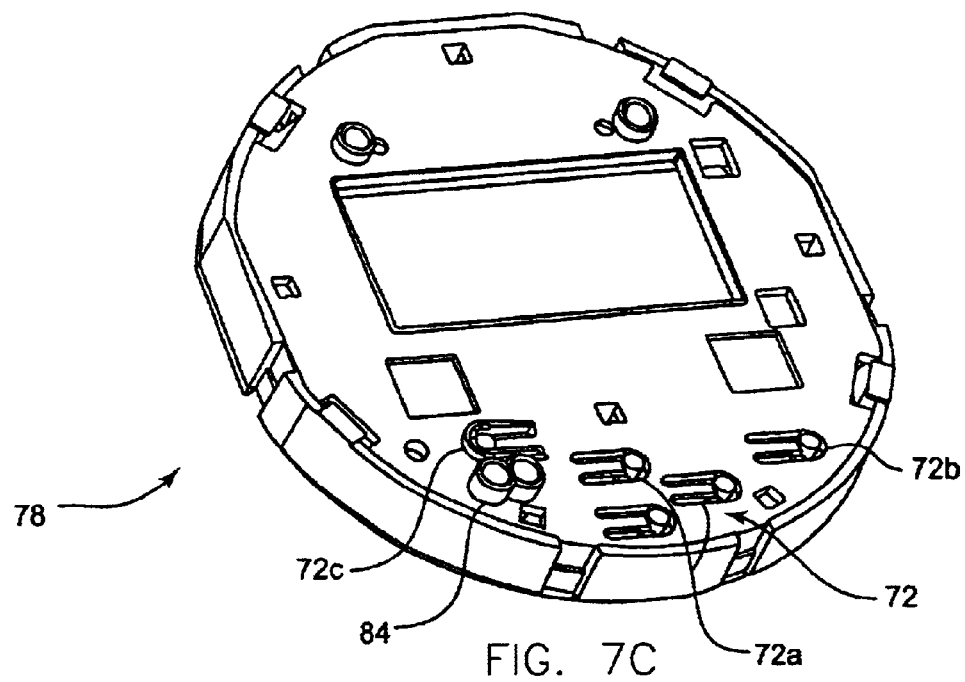
FIG. 7C shows a top perspective view of the bezel shown in FIG. 7A.
Figure 7D:
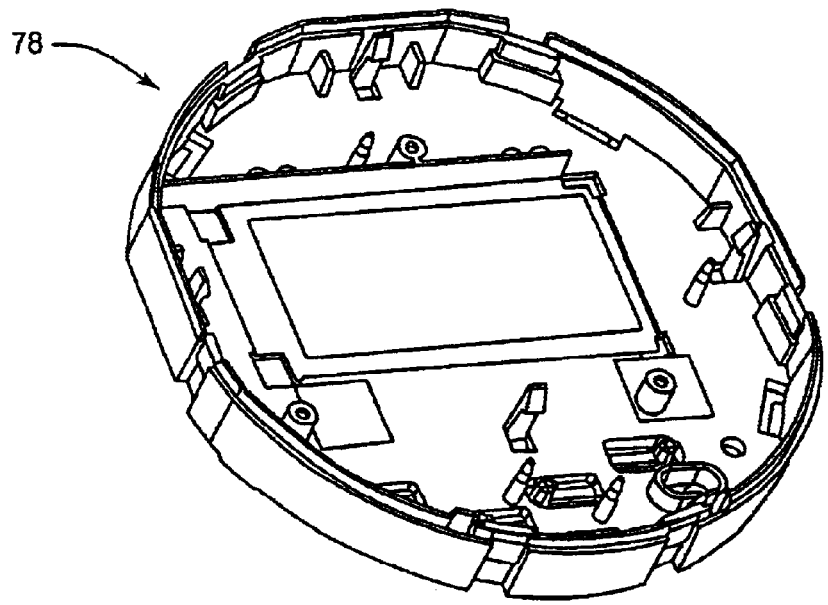
FIG. 7D depicts a bottom perspective view of the bezel shown in FIG. 7A.

Referring to FIGS. 6A and 6B, to mechanically connect the keypad 32 to the revenue meter 26, intermediate actuators 72 transfer the keypad's motion to micro switches 74 mounted on a printed circuit board 76. Referring also to FIGS. 7A–7D, according to a preferred embodiment, the intermediate actuators 72 are contained within bezel 78. The intermediate actuators 72 include intermediate key actuators 72a, an intermediate reset demand actuator 72b, and an intermediate test mode actuator 72c which is accessible only when the cover 24 is removed. Thus, unlike known demand reset keys which include multiple parts, including a spring, fasteners and lever arms, the bezel 78 of the present invention allows for a one piece demand reset key.

When the user depresses keys 52, the web 66 (shown best in FIG. 5A) allows the plunger 64 to interact with the intermediate actuators 72 located on the bezel 78, which in turn contact the micro switch 74. Preferably, the micro switch 74 has spring back like qualities so that, after it is depressed, it rebounds to aid in the return the plunger 64 to a default position. Preferably, the web 66 and the intermediate actuators 72 have spring back qualities that also aid in the return of the plunger 64 to the default position. It can be appreciated that the intermediate actuators 72 may be eliminated when the micro switch 74 is mounted to directly contact the plunger 64.

For the keypad 32 to properly function, the keys 52 and the demand reset button 56 must properly align to the intermediate actuators 72 of the bezel 78. In addition, infrared emitters (not shown) located within the infrared locating member 54 must align to the infrared light pipes 59. Referring to FIG. 3, the Switchboard revenue meter 42 experiences similar alignment problems of the keypad 32 to the intermediate actuators 72.

Figure 8:
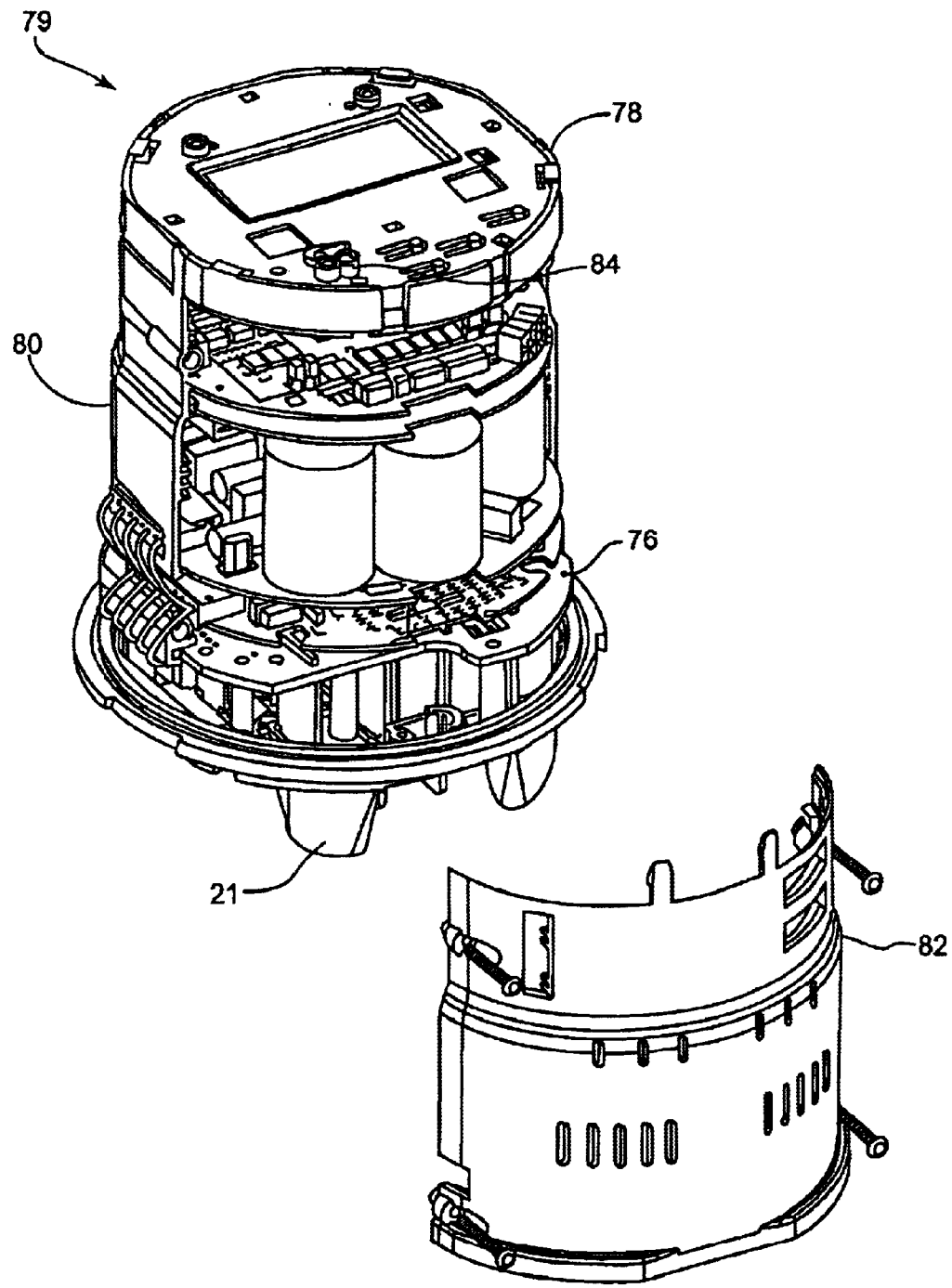
FIG. 8 shows a partially assembled S-base meter depicted in FIGS. 1 and 2, without the cover.

Referring to FIGS. 1 and 2, alignment is more difficult for the S-Base revenue meter 20 and the A-base revenue meter 34, since both the revenue meters 20, 34 and the corresponding covers 24 have a generally cylindrical shape. Referring to FIG. 8, to make alignment even more difficult, the internal structure 79 of the revenue meters 20, 34 may lean and twist after it is assembled. The revenue meter 20, 34 includes a skeleton 80 which accommodates the base 21, the printed circuit board 76, and the bezel 78. In addition, a backdoor 82 attaches to the skeleton 80 to enclose the electronics 26 of the revenue meters 20, 34. Due to tolerances in the manufactured parts and the assembly process, the assembled internal structure 79 may affect the alignment of the keypad 32 to the intermediate actuators 72.

Figure 9:
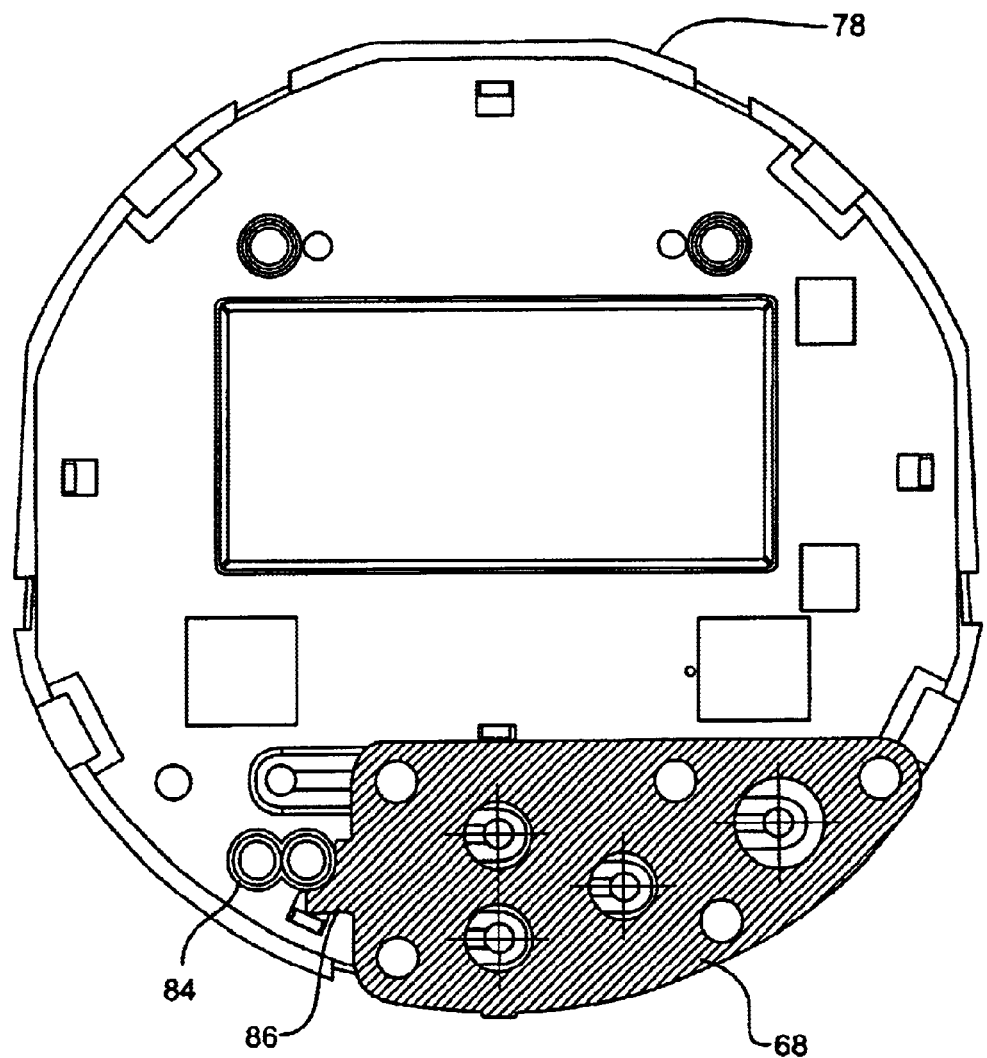
FIG. 9 depicts the bezel shown in FIGS. 7A–7D, with a compression plate abutting infrared bosses to align to the cover according to a preferred embodiment of the present invention.

Referring to FIG. 9, to align the keypad 32 to the intermediate actuators 72, a preferred embodiment of the present invention utilizes infrared bosses 84 on the bezel 78 to align the infrared light pipes 59, and a locating portion 86 of the compression plate 68. When assembling the cover 24 over the internal structure 79, the cover is twisted until the base 21 stops the cover 24. The locating portion 86 of the compression plate 68 abuts the infrared bosses 84 to align the internal structure 79 of the revenue meter as the cover 24 is twisted. Thus, when assembling the cover 24, as the location portion 86 of the compression plate 68 abuts the infrared bosses 84, the internal structure 79 twists to align the keypad plungers 64 with the intermediate actuators 72 and to line up the infrared light pipes 59 to the emitters located within the infrared bosses 84. Of course, other features attached to the cover 24 could be utilized to align the internal structure 79 of the revenue meter such as a post connected with cover 24.

Figure 10:
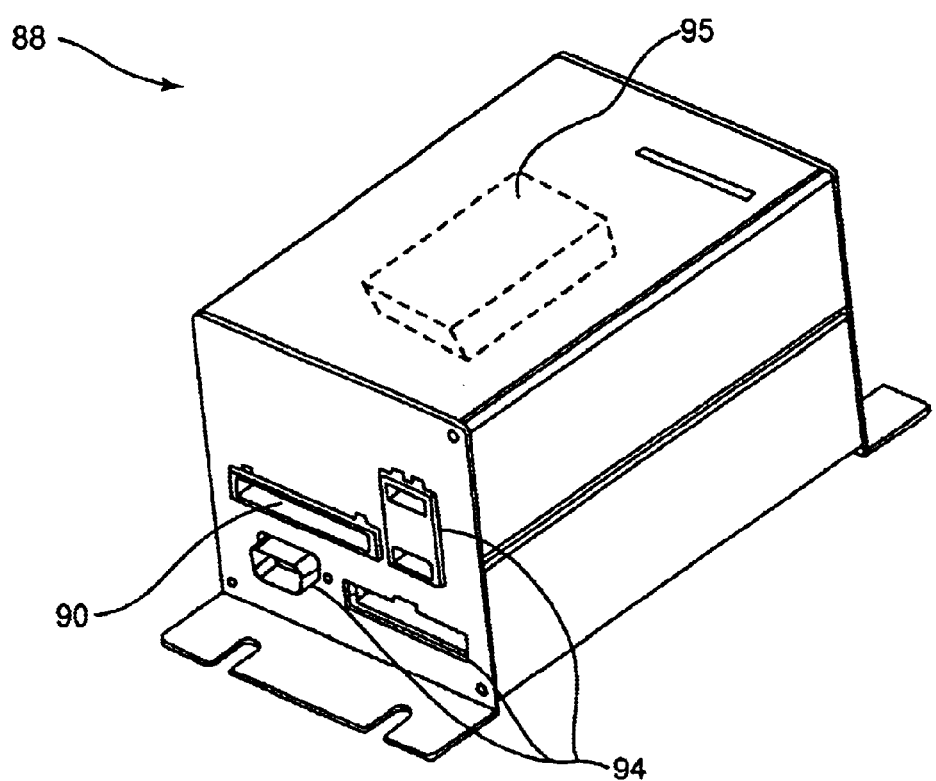
FIG. 10 depicts a front perspective view of an exemplary external enclosure of the I/O and communications device according to a preferred embodiment of the present invention.
Figure 11:
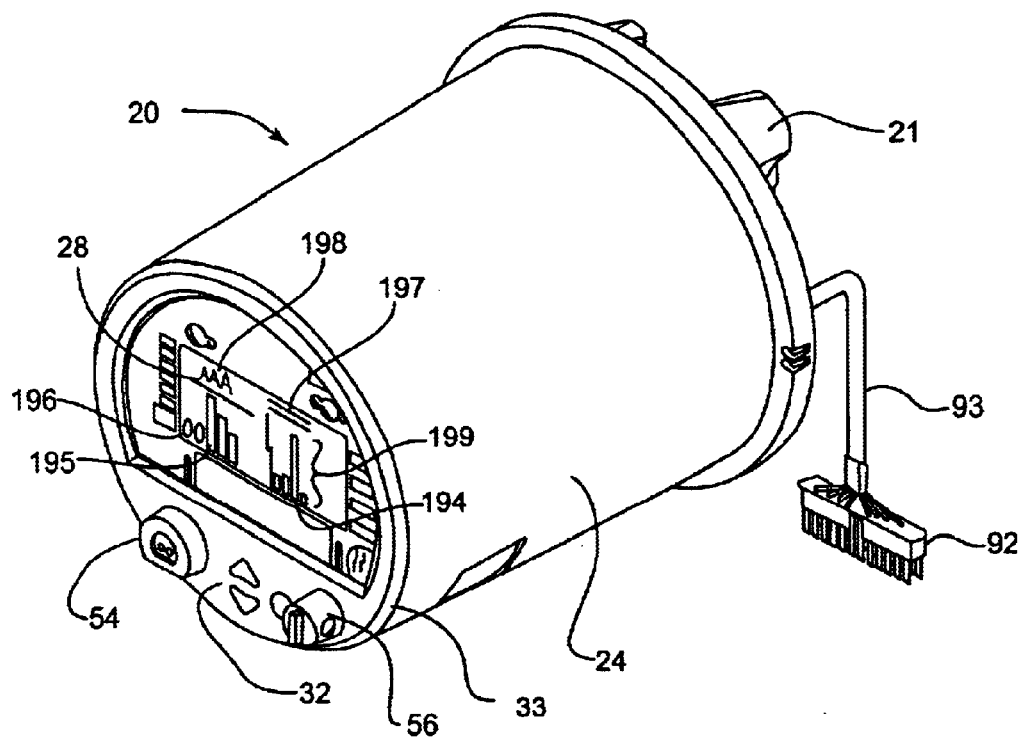
FIG. 11 shows the revenue meter of FIGS. 1–3, with an exemplary serial link interface of a preferred embodiment of the present invention.
Figure 11A:
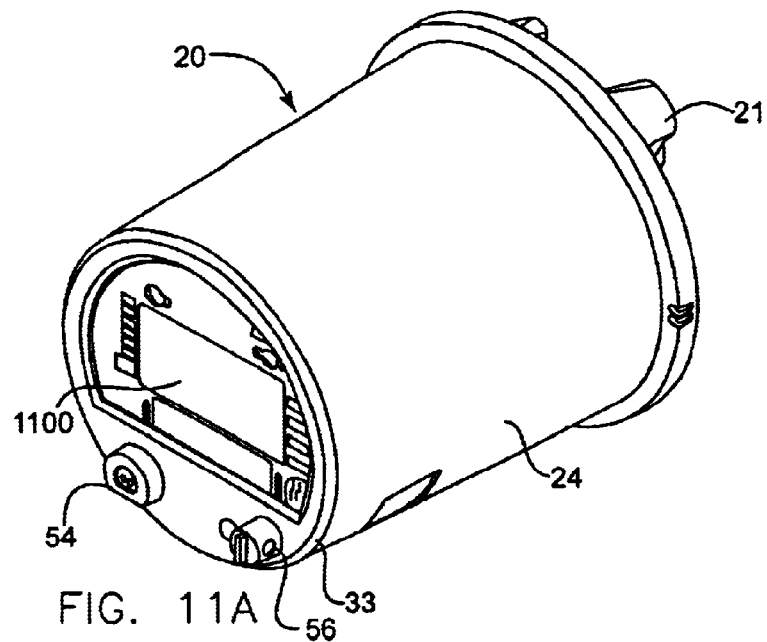
FIG. 11a shows the revenue meter of FIGS. 1–3 with a touch screen input device coupled to the meter.
Figure 11B:
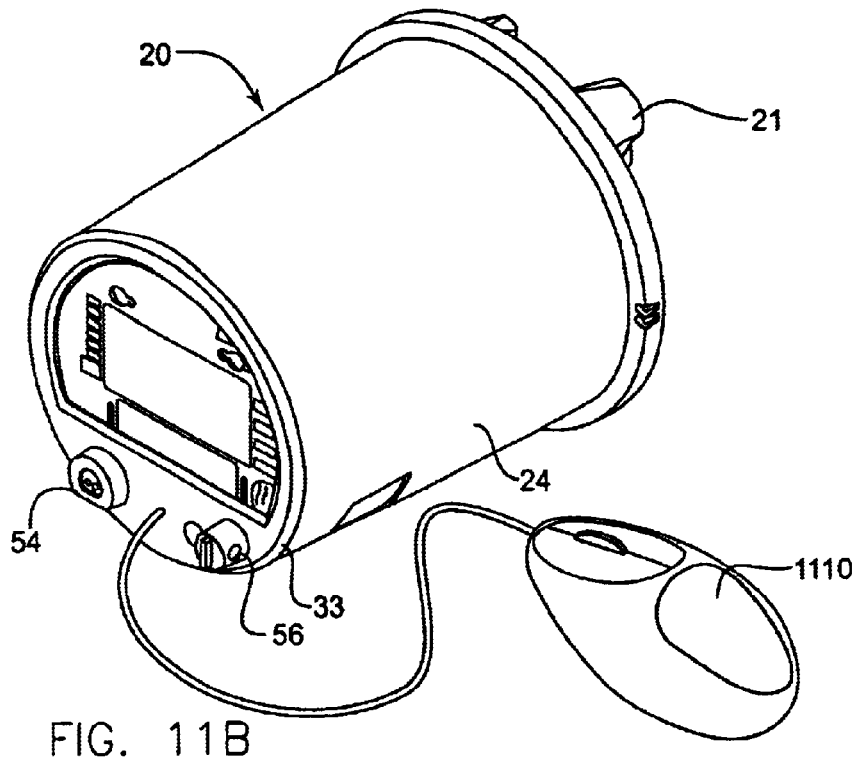
FIG. 11b shows the revenue meter of FIGS. 1–3 with a mouse input device coupled to the meter.
Figure 11C:
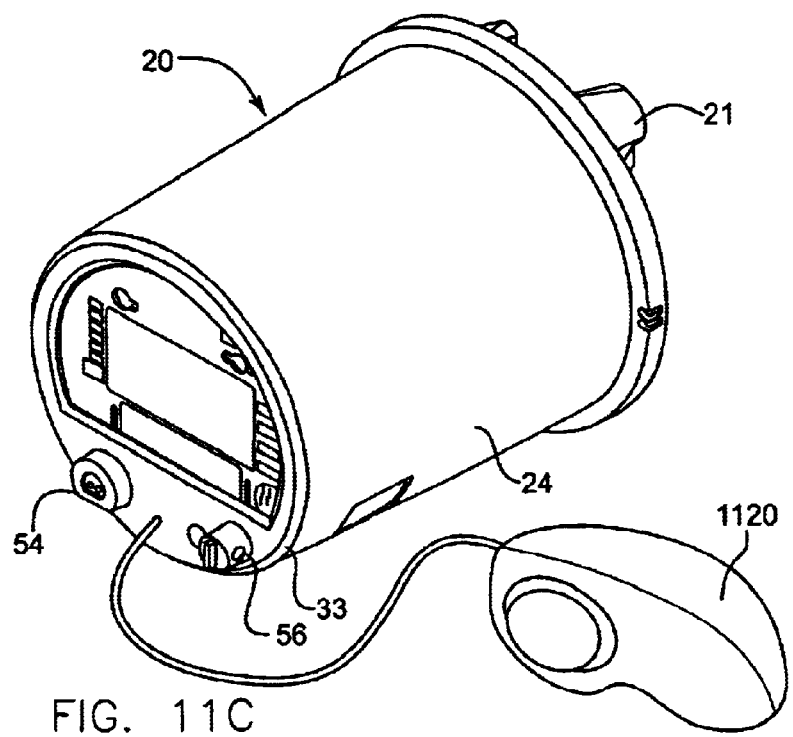
FIG. 11c shows the revenue meter of FIGS. 1–3 with a track ball input device coupled to the meter.
Figure 11D:
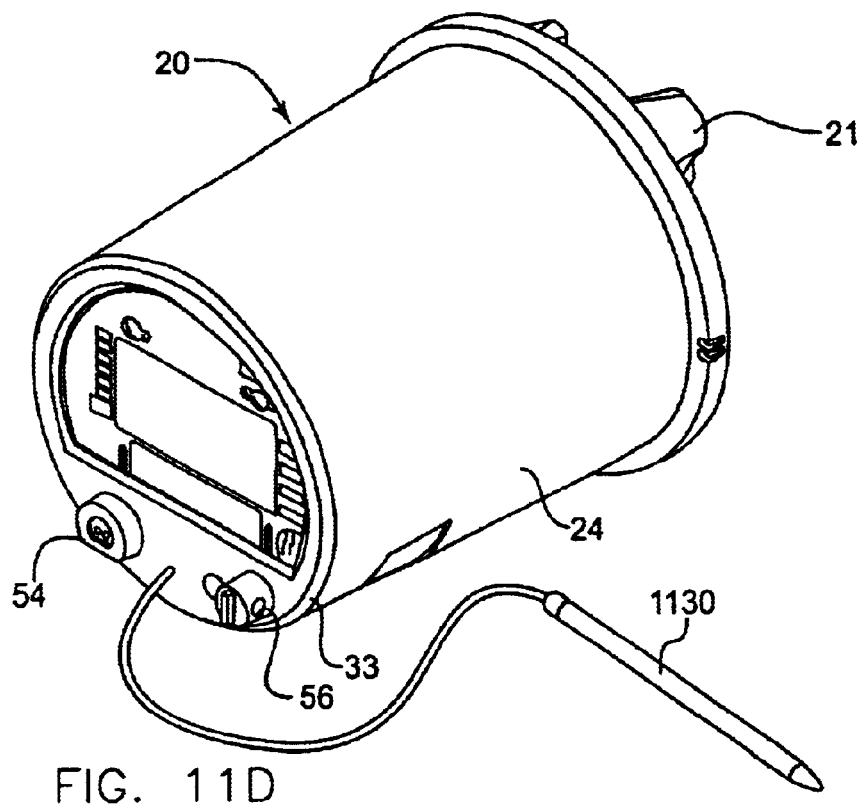
FIG. 11d shows the revenue meter of FIGS. 1–3 with a light pen input device coupled to the meter.
Figure 11E:
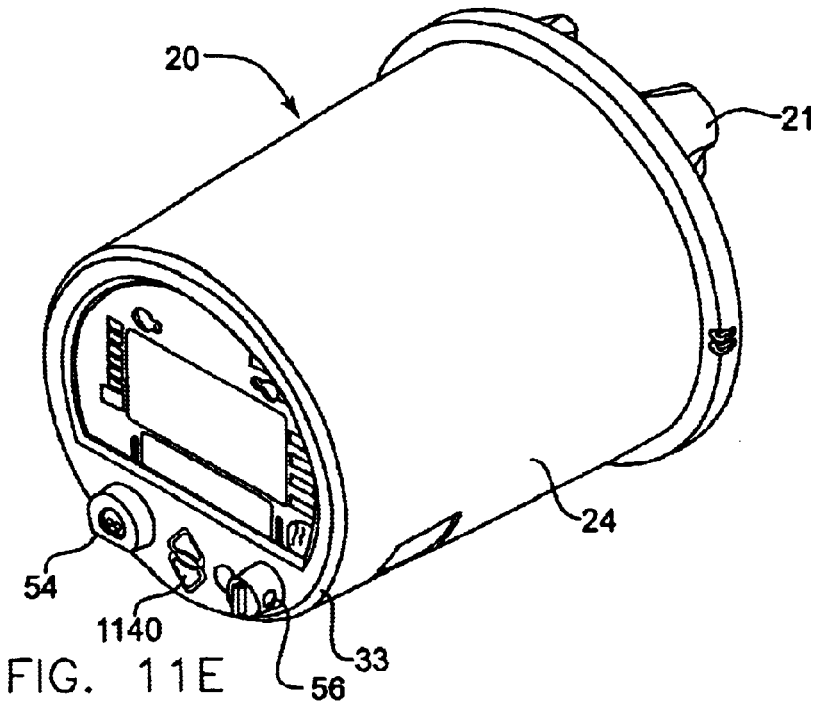
FIG. 11e shows the revenue meter of FIGS. 1–3 with a membrane switch input device coupled to the meter.
Figure 11F:
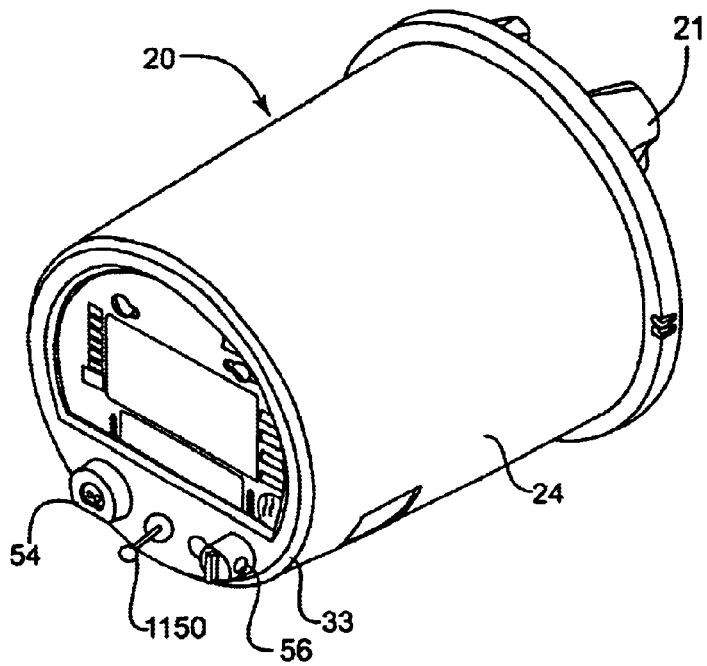
FIG. 11f shows the revenue meter of FIGS. 1–3 with a joystick input device coupled to the meter.
Figure 11G:
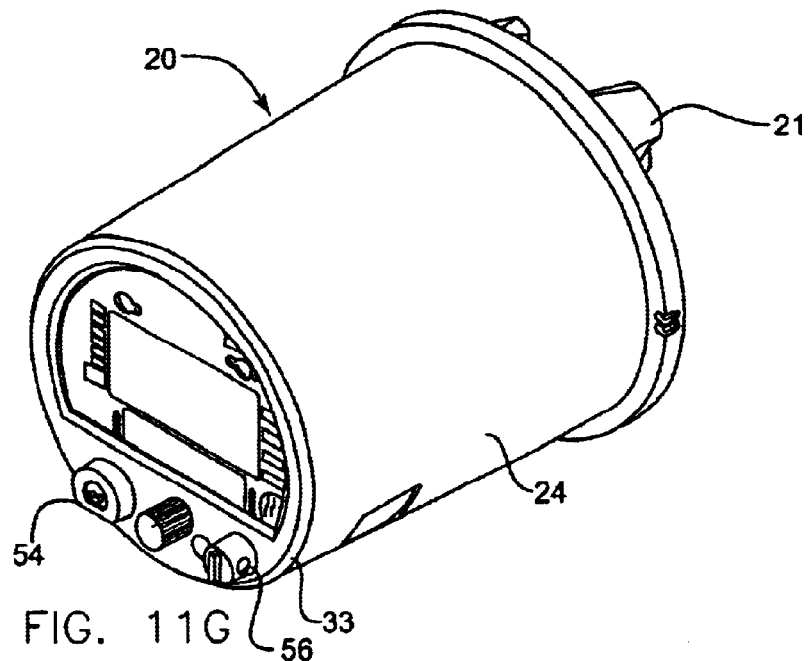
FIG. 11g shows the revenue meter of FIGS. 1–3 with a dial input device coupled to the meter.

Referring to FIG. 10, in addition to the above described keypad for a revenue meter, the present revenue meter 20, 34, 42 includes an external I/O and communications device 88. The I/O and communications device is physically separated from the meter enclosure to improve interfacing capabilities of the revenue meter, as described below. Referring to FIG. 11, the I/O and communications device 88 includes an I/O and communications connector 90 which accommodates connection to the revenue meter 20, 34, 42 via an interface link 92, shown in FIG. 11. The interface link 92 is preferably located in the base 21 of the meter 20, 34, 42 or at the end of a section of cable 93 protruding from the meter 20, 34, 42. The cable 93 also contains power for the I/O and communications device 88.

In a preferred embodiment, analog and digital signals are transported via a serial link bus terminating in a twenty-four pin connector. Artisans will appreciate that the cable 93 can include a copper or fiber optic interface, or the equivalent, and that pin connectors of differing sizes can be used. Moreover, the I/O and communications device 88 includes alternate connectors 94 to accommodate other connection to the revenue meter, such as a modem and ethernet connections, e.g., RS 232 and RS 485 connections.

The interface link 92 allows for simplified connection of the revenue meter 20, 34, 42 to the I/O and communications device 88. Labeled connectors 90, 94 on the I/O and communications device allow for easy wiring. Plugability of the I/O and communications device to the socket based revenue meter 20, 34, 42 greatly simplifies servicing and replacing of the meter. The meter is removed without having to unscrew or unclamp any communications and I/O connections. In addition, the I/O and communication device 88 eliminates the necessity of locating individual conductors out of a bundle of wires. Connector 90 on the I/O and communication device 88 allows the installer to plug the interface link 92 into the I/O communication device 88 to hook up all wires to the desired I/O and communications ports at once.

In a preferred embodiment, a dedicated microprocessor 95 located inside the I/O and communication device 88 processes I/O and communication data and passes the data to and from the revenue meter 20, 34, 42 via the interface link 92. The interface link 92 connects to the microprocessor via known circuitry. The microprocessor 95 helps to reduce the load on the meter's processor. In addition, the microprocessor 95 allows for I/O and communications that are expandable and not limited to the number of conductors leaving the revenue meter. An exemplary microprocessor is model number PIC16C67 which is manufactured by Microchip Technology, located in Chandler, Ariz. Of course, other microprocessors can be used.

Data flow between the revenue meter 20, 34, 42 and the I/O and communications device 88 is controlled with data packets. Known techniques, such as RS 422, are used to serially send and receive the data packets to the revenue meter 20, 34, 42. In a preferred embodiment, the speed of the interface is 625 kilobits per second (kbps), but other rates are possible. The following description shows exemplary packets that are utilized to transmit between the revenue meter 20, 34, 42 and the external I/O and communications device 88. For the sake of simplicity, the packet transmission is described with reference to only one external I/O and communications device 88. It should be appreciated, however, that the protocol described herein supports one or more external I/O and communications devices 88.

Packets

The first external I/O and communications device 88 is the master on the bus, and thus initiates all data transfers. In a preferred embodiment, the interface is full-duplex, therefore data flows in both directions at once. The I/O and communications device 88 reports its input states while the revenue meter 20 transmits output states. Preferably, all data packets are error checked using a cyclic redundancy check. If a transmission error is detected, no retry is attempted, the packet is ignored and the states are updated on the next transaction.

Preferably, all packets are fixed length, therefore, the processor receiving the packet always knows where the end of the packet should be. In the following packet descriptions, an 'x' indicates four bits, for example, that are set to indicate a value in the corresponding packet. Artisans will appreciate that the number of bits per packet can be Increased to produce a nearly infinite combination of packet values.

Input Packet Structure

In a preferred embodiment, an input packet is transmitted from the I/O and communications device 88 to the revenue meter 20. The packet indicates the state of the various inputs within the I/O and communications device 88.

| Module# | A/D | Mask | Data | Time1 | ... | Time16 | Pckt Time | CRC |
|---|---|---|---|---|---|---|---|---|
| 00000010XX | XXXX | XXXX | XXXX | XXXX | XXXX | XXXX | XXXX | XXXX |

Module#—The I/O and communications device number (xx) that reports the inputs. Based on the packet structure, up to 256 I/O and communications devices are possible.

Pckt Time—A free running timer value (xxxx) when the transmission of the packet began. In a preferred embodiment, one count occurs per 3.2 us.

A/D—16 bits that indicate whether the, up to, 16 inputs on the device are analog or digital. For example, analog=1 or digital=0.

Mask—16 bits that indicate whether the, up to, 16 inputs on the device have changed since last update. For example, yes=1 and no=0.

Data—16 bits that indicate the digital value of the, up to, 16 inputs on the device.

Time Y—The free running timer value, preferably 3.2 microseconds per count, when the digital input value was recorded if the corresponding A/D bit is 0. Or, the 16 bit analog value of the input if corresponding A/D bit=1.

CRC—The packet CRC.

Output Packet Structure

In a preferred embodiment, an output packet is transmitted from the revenue meter 20. The output packet contains the output state that the meter wants to appear on the revenue meters outputs.

| Module# | Data | Analog1 | ... | Analog16 | CRC |
|---|---|---|---|---|---|
| 00000010XX | XXXX | XXXX | XXXX | XXXX | XXXX |

Module#—The I/O and communications device number (xx) that is to receive the outputs. Based on the packet size, up to 256 I/O and communications devices are possible.

Data—16 bits indicating the digital value of the, up to, 16 digital outputs on the device. Each individual bit is ignored by the destination if the output is analog.

Analog Z—A 16 bit analog output value for analog output Z.

This packet is ignored if the output is digital.

CRC—The packet CRC.

Config Packet Structure

The revenue meter 20 is able to power cycle the master external I/O device. When the master I/O and communications device 88 first powers up, it is responsible for transmitting the CONFIG packet for the master and any attached slave I/O and communications devices. The master I/O and communications device must continue transmitting the CONFIG packet(s) until each CONFIG packet is acknowledged.

| Module# | Type 1 | ... | Type16 | CRC |
|---|---|---|---|---|
| 1000000yXX | XXXX | XXXX | XXXX | XXXX |

Module#—The external I/O and communications device number that contains the configuration (XX). Based on the packet structure, up to 256 devices are possible. 'y' indicates whether the I/O and communications device is present. For example, present=1 and absent=0. Absent packets are only transmitted when the I/O and communications device is removed from a powered system. Since the I/O and communications device 88 cannot initiate the transmission of a CONFIG packet when power is removed, the revenue meter is responsible for detecting that the master i/O and communications device is removed.

Type X—16 bits indicating the type of input or output of a particular port on the I/O and communications device 88. For example:

| Type | Point |
|---|---|
| 0x0 | FormA Digital Output |
| 0x1 | FormC Digital Output |
| 0x80 | DC Digital Input |

CRC—The packet CRC.

ConfigAck Packet Structure

A CONFIGACK packet is used by the revenue meter to acknowledge that the CONFIG packet has been received. The master I/O and communications device transmits the CONFIG packet at least twice for each I/O and communications device present in order to receive an acknowledgement since the revenue meter cannot initiate a transfer an data is received from the meter while it is being transmitted by the I/O and communications device.

| Module# | Pad | Pad | CRC |
|---|---|---|---|
| 10000010XX | | | XXXX |

Module#—The I/O and communications device number (XX) acknowledged by the revenue meter.

Pad—Padding for future use.

CRC—The packet CRC.

Flow diagram

Figure 12A:
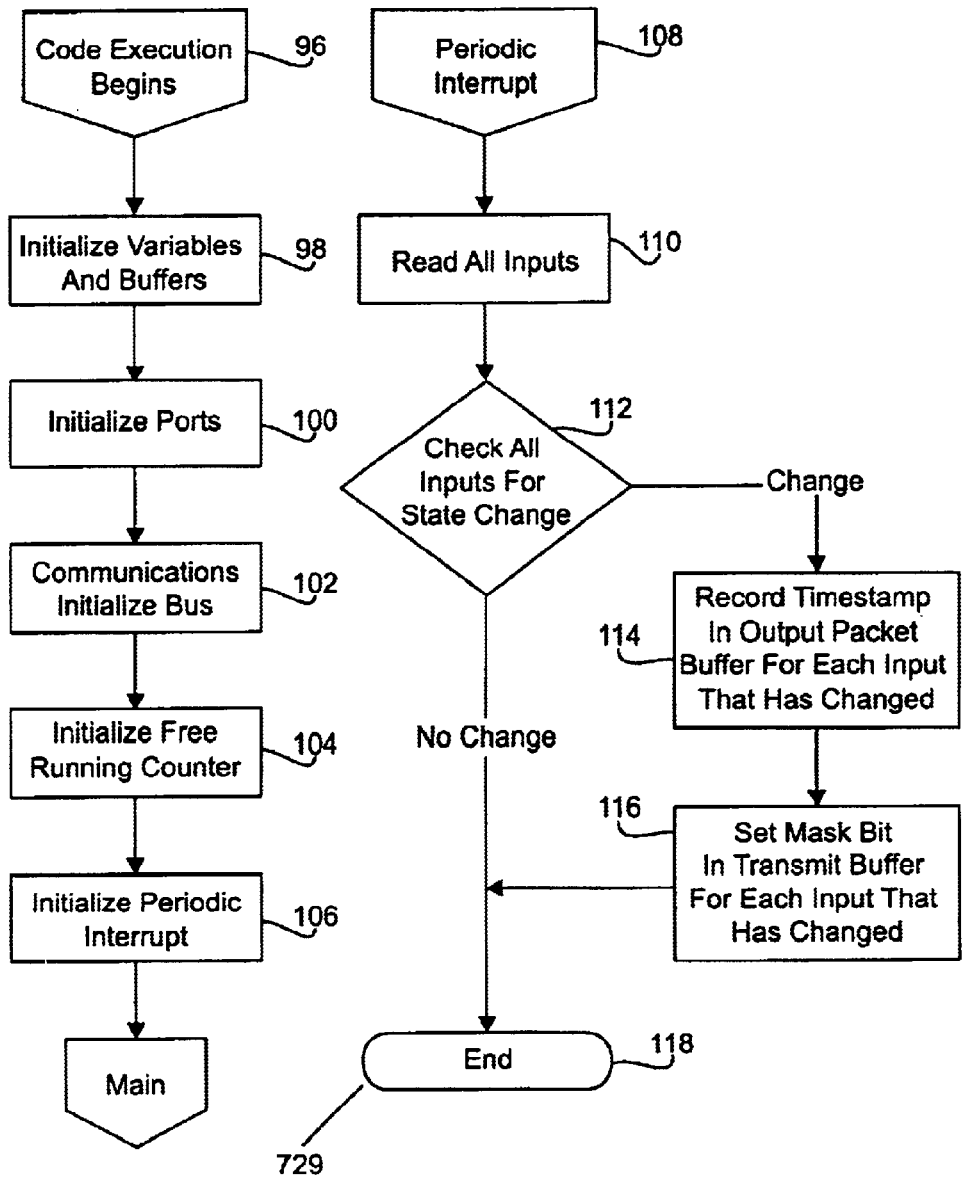
FIG. 12A–12D show a flow chart representing serial communication and operations between the revenue meter and the I/O communications device according to a preferred embodiment of the present invention.

Referring to FIG. 12A, a flow chart is shown to describe a preferred operation of the I/O and communications device 88. After the revenue meter 20, 34, 42 is powered on, preferably a firmware or software initialize routine begins (block 96). The initialize routine initializes variables and buffers that contain counting and input state information (block 98). For example, variables are used to determine a next input to be read.

Figure 12B:
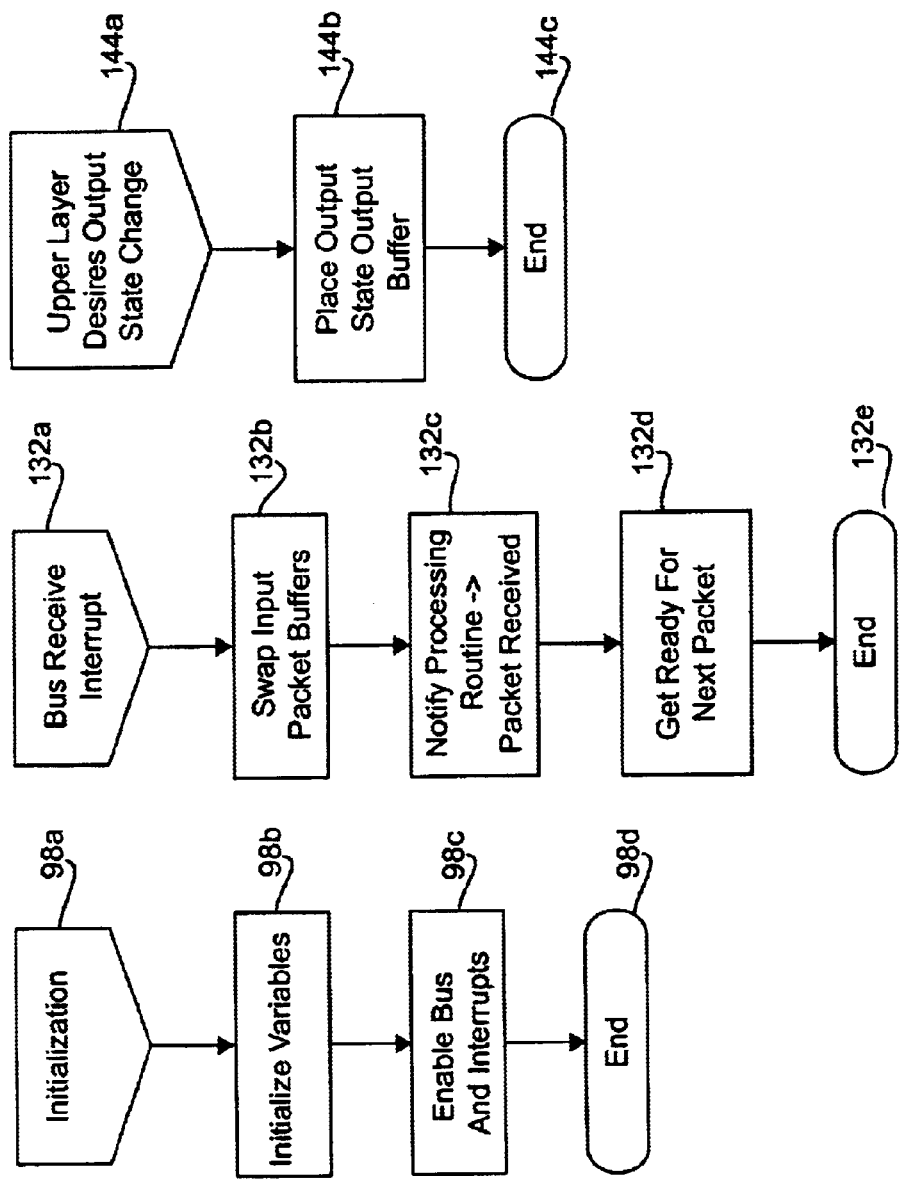

Referring also to FIG. 12B, on the revenue meter's initialization a routine is called, for example, an initialization subroutine. When the initialization subroutine is called (block 98a), variables used by the bus interface routines are initialized (block 98b) and the bus subsystems and interrupts are enabled (block 98c). Thereafter, the initialization subroutine terminates (block 98d).

Referring to FIG. 12A, the initialize routine initializes I/O ports, e.g., configures pins as either input or output pins (block 100). The I/O ports are used, for example, to control a state of a load, e.g., generator, to turn the load either on or off. In addition, the routine initializes a link utilized to communicate with the revenue meter 20, 34, 42 by setting the speed and format of the data to be transmitted (block 102). For example, the routine configures control registers included in the microprocessor 95 that control the data's speed and format.

Moreover, the routine initializes a free running counter (block 104) and a periodic interrupt (block 106). In a preferred embodiment, an interrupt interrupts the microprocessor 95 every 819.2 microseconds, although other rates are possible. When the periodic interrupt occurs, a main routine is interrupted and execution continues in a periodic interrupt subroutine (block 108). After the occurrence of a periodic interrupt, the microprocessor 95 reads all digital input ports (block 110) and checks the input ports against the their state during the previous execution of the periodic interrupt subroutine (block 112). Each input is checked, and if an input has changed, a timestamp is recorded, e.g., a current value of a free running counter is stored in a corresponding location in the transmit buffer for that input (block 114).

It is necessary to timestamp the transition time of an input on the external I/O device 88 based on the time in the revenue meter 20, 34, 42 since the microprocessors in the revenue meter and external I/O and communications device are not time synchronized. The external I/O and communications device 88 preferably scans inputs every 819.2 microseconds. When the I/O and communications device 88 sees a transition on an input, it stores the free running counter in the input packet. This free running counter ideally increments every 3.2 microseconds. When the external I/O device is transmitting the input packet to the meter, just before transmitting the last four bytes of the packet, for example, it inserts the current free running counter into the $3^{rd}$ and $4^{th}$ last bytes. This ensures that the free running counter value inserted into the packet is as close as possible to the value it would be at the end of packet transmission. When the revenue meter 20, 34, 42 receives the packet, it calculates the time of transition of any of the inputs with the following formula:

$$t_t = t_n - (f_{pck} - f_{tr} + f_{ink}) * FT$$

where:

$t_t$=the time of transition.

$t_n$=the time on the meter at the time the packet is received.

$f_{pck}$=the free running counter at the time the packet is transmitted.

$f_{tr}$=the free running counter value when the input was scanned and seen to have transitioned.

$f_{ink}$=the inherent typical number of free running counts from the time that the $f_{pck}$ is recorded on the I/O and communications device and the packet is received on the revenue meter.

FT=the conversion factor between free running counts and normal time, e.g., 3.2 microseconds/count.

Therefore, the only variability left in the calculation of transition time is the variability of $f_{ink}$ and the accuracy that the revenue meter can timestamp the communications bus receive interrupt.

After the timestamp information is recorded, an appropriate mask bit is set in the transmit buffer indicating that the input has changed (block 116). These values are transferred for processing by the revenue meter 20, 34, 42. Thereafter, or if the input had not changed, execution of the periodic interrupt service routine terminates (block 118).

Figure 12C:
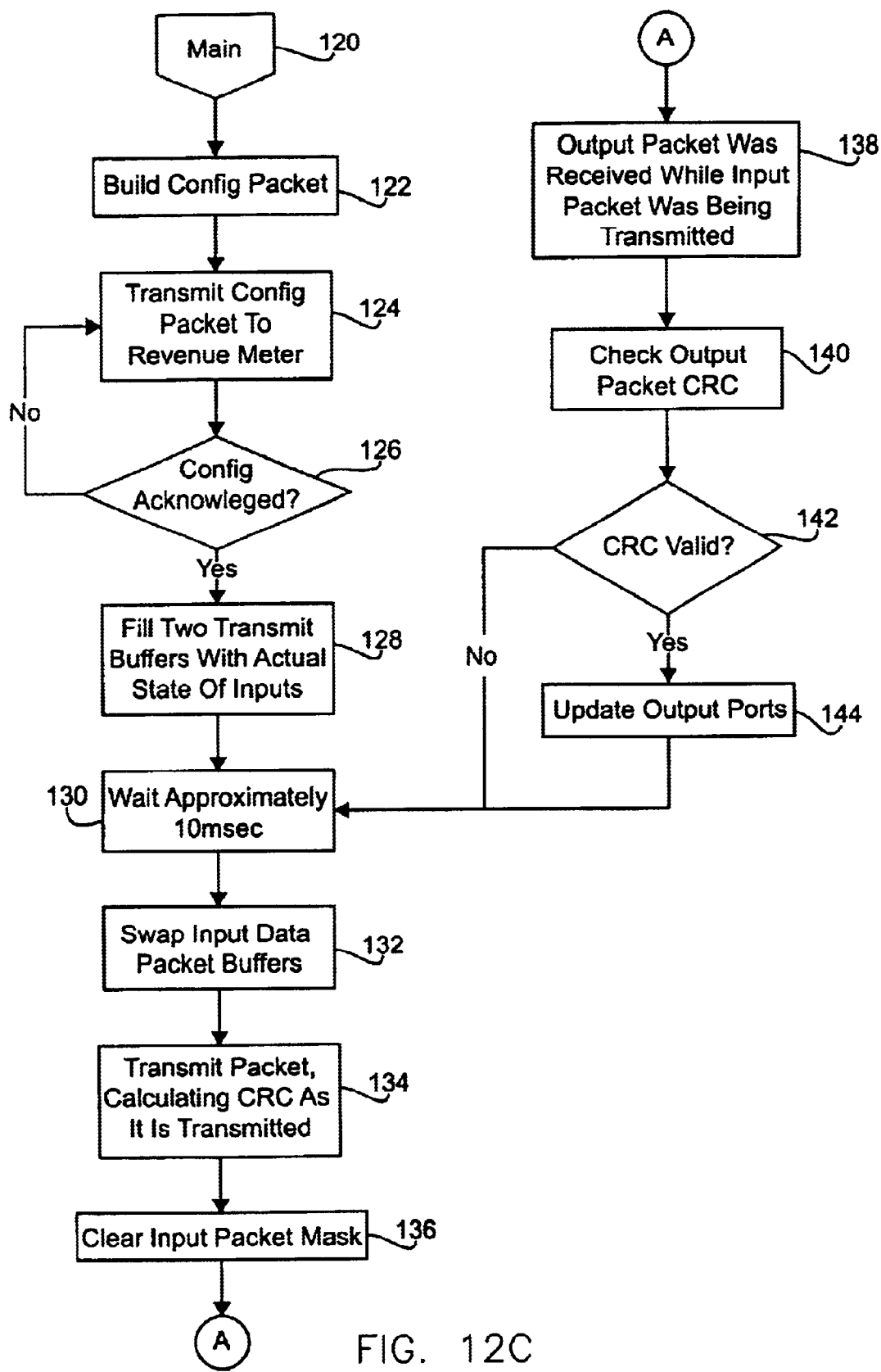

Referring to FIG. 12C, once initialization is complete, code execution continues at a main routine (block 120). First, the CONFIG packet is built, as described above, to indicate the configuration of the external I/O device (block 122). The CONFIG packet is continually transmitted to the revenue meter 20, 34, 42 (block 124) until the revenue meter 20, 34, 42 acknowledges the CONFIG packet (block 126). Preferably, code on the microprocessor double buffers the digital input states. Thereafter, the two input packets are initialized with the actual input states (block 128).

The I/O and communications device 88 waits approximately 10 milliseconds (block 130). This delay, coupled with the time to execute the remaining blocks in the main routine, ensures that the I/O and communications device 88 transmits and receives a packet to and from the revenue meter 20, 34, 42 approximately every 13 milliseconds. While other rates are possible, this rate ensures quick update without overloading the meter. The use of the 13 millisecond delay may be varied depending on a processing power of the revenue meter 20, 34, 42, and how often input states are likely to change. The delay is utilized to reduce the flow of data packets that the revenue meter 20, 34, 42 is required to process.

A first input data packet buffer and a second input data packet buffer are swapped to ensure that the main routine is transmitting input states from the first buffer while the periodic interrupt routine stores input states in the second buffer (block 132). When the revenue meter's microprocessor receives a packet, it executes a bus interrupt service subroutine (block 132a). This bus interrupt service subroutine swaps the input packet buffers (block 132b) so that the next data received does not overwrite the current data before being processed. The bus interrupt service routine then notifies the main routine (block 146) that a packet has been received (block 132c) and prepares to receive the next packet (block 132d). Thereafter, the bus interrupt service routine terminates (block 132e).

Referring to FIG. 12C, the input data packet is transmitted to the revenue meter 20, 34, 42 (block 134). The CRC for the packet is calculated as the packet is being transmitted so that the Pckt Time element in the packet is as close as possible to the actual value of the free running counter at the end of the packet (block 134). If the CRC was calculated before the packet began transmission, the Pckt Time element of the packet would be offset by the time required to calculate the CRC and transmit the packet. In addition, the Mask in the transmitted packet is cleared so that the second buffer can be used by the interrupt routine the next time the buffers are swapped (block 136).

While the input data packet is being transmitted, an output data packet is being received since the bus is full duplex (block 138). The output data packet's CRC is checked (block 140). If the CRC is valid (block 142), the output ports on the microprocessor 95 are updated (block 144), and another 10 milliseconds elapse before the main routine continues (block 130). Referring also to FIG. 12B, when the main routine requests a state change in the external I/O and communications device (block 144*a*), a "place output state subroutine" places the output state into the output buffer (block 144*b*) and the "place output state subroutine" then terminates (block 144*c*). If the CRC is invalid, however, execution continues without updating the output ports.

Figure 12D:
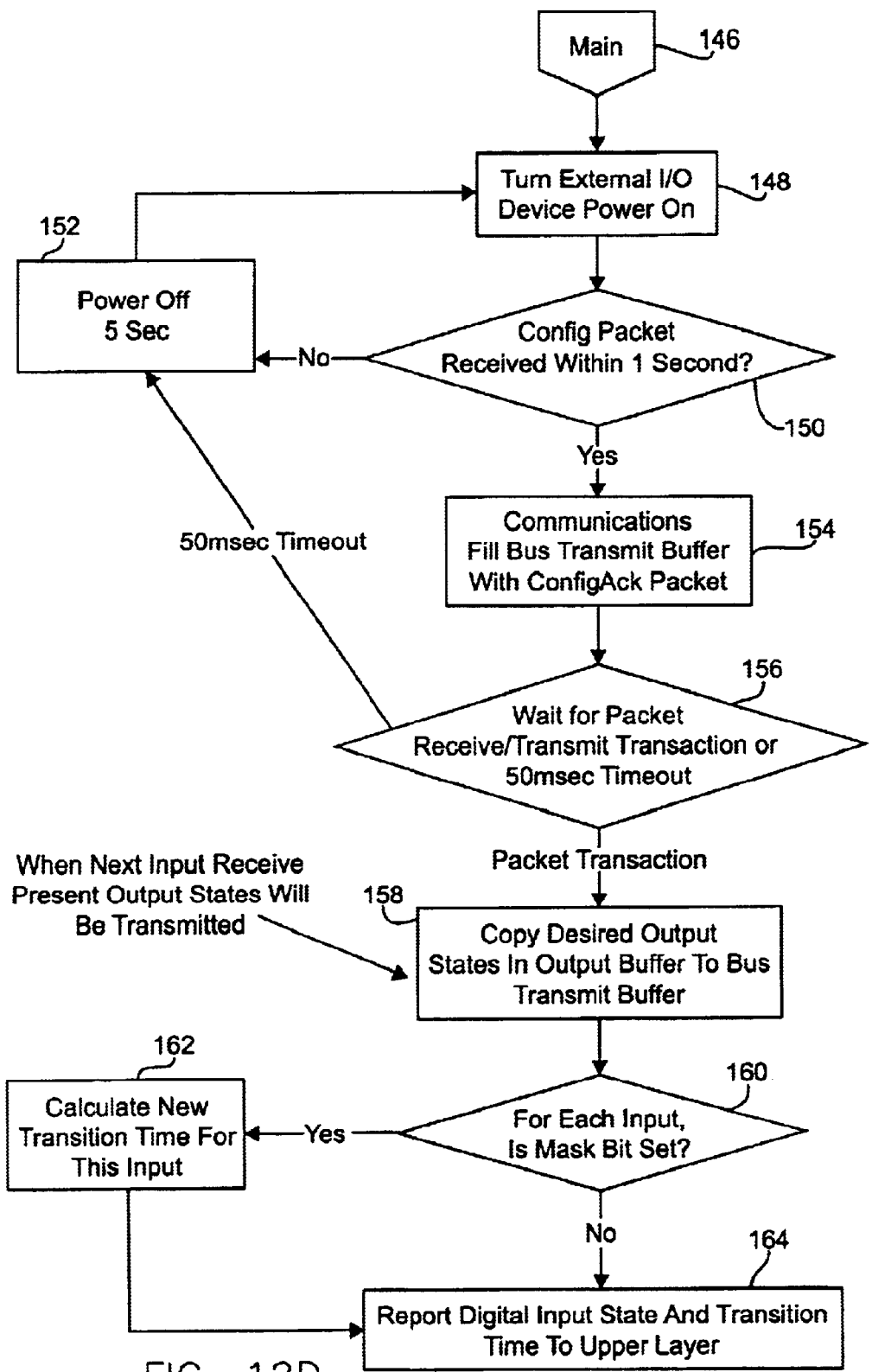

Referring to FIG. 12D, a processing routine is called for processing input states from the I/O and communications device 88 and sending output states to the I/O and communications device (block 146). The processing routine activates power to the external I/O and communications device 88 (block 148). The power switching is accomplished, for example, using a TPS2011A Power Distribution Switch, manufactured by Texas Instruments, located in Dallas, Tex., configured in a manner known in the art. Of course other switches can be used. If a valid CONFIG packet is received from the external I/O and communications device 88 within, for example, a predetermined time period (block 150) execution continues. In other words, execution of the processing routine continues if the bus interrupt subroutine notifies the processing routine of an incoming bus packet that is a valid CONFIG packet (see FIG. 12B, block 132*c*). In a preferred embodiment, the predetermined time period is one second.

If no valid CONFIG packet is received within one second, the external I/O and communications device 88 is turned off for a predetermined turn off period (block 152) and then turned back on (block 148). In a preferred embodiment, the predetermined turn off period is five seconds. Of course, the one and five second predetermined times may be modified to suit the situation. The I/O and communication device 88 is power cycled to ensure that the I/O and communications device 88 starts code execution from a known state. Turing the I/O and communications device 88 off for five seconds ensures that the I/O and communications device 88 is in communication with the revenue meter 20, 34, 42 fairly quickly after a user plugs In the I/O and communications device 88.

Once a valid CONFIG packet has been received, the revenue meter 20, 34, 42 fills the outgoing bus transmit buffer with a CONFIGACK packet (block 154). The CONFIGACK packet is transmitted to the external I/O and communications device 88 when the next packet is received from the external I/O and communications device 88. Thereafter, the revenue meter 20, 34, 48 waits for a valid receive/transmit packet operation to complete or for timeout to occur (block 156). In a preferred embodiment, the a duration of the timeout is 50 milliseconds. If a 50 millisecond timeout occurs, the I/O and communications device 88 is either faulty or has been removed since the I/O and communications device 88 transmits packets approximately every 13 milliseconds.

If the timeout occurs, execution continues as though the I/O and communications device 88 is absent (block 152). If a packet is received, the output states are copied from the revenue meter 20, 34, 42 into the bus transmit buffer for transmission the next time the I/O and communications device 88 initiates a packet transaction (block 158). An output state changes when, for example, a user uses the keypad 32 described above to change a fan state from on to off, and off to on, and a set point module overrange can be triggered within the revenue meter 20, 34, 42 to shut down a load. As the microprocessor 95 receives data packets containing the output states, the data packets are processed to acquire the output state information, and the output states are set (block 144). The output state is utilized by relay hardware, for example, to turn a load on or off.

Thereafter, the revenue meter 20, 34, 48 checks the received packet mask for inputs that have changed since the last transaction (block 160). For each input that has changed state, the meter calculates the transition time (block 162), as described above. In either case, the revenue meter 20, 34, 42 reports the input states and transition times to the upper layer an upper layer of the code responsible for reporting input states to structures which are internally utilized or reported to the user (block 164), and waits for the next packet (block 156).

From the foregoing description, it should be understood that improved revenue meter interfaces have been shown and described which have many desirable attributes and advantages. The revenue meter of the present invention provides easily accessible and easy to use interfaces that include a front panel keypad, and I/O and communications connections. The keypad allows a user to interact with the meter without requiring a breach to a security seal. In addition, the interface provides an external I/O and communications interface that is expandable and not limited to the number of conductors leaving the revenue meter.

It is to be understood that changes and modifications to the embodiments described above will be apparent to those skilled in the art, and are contemplated. It is therefore intended that the foregoing detailed description be regarded as illustrative rather than limiting, and that it be understood that it is the following claims, including all equivalents, that are intended to define the spirit and scope of this invention.

What is claimed is:

1. A revenue meter for measuring the delivery of electrical energy from an energy supplier to a consumer through an electric circuit, the revenue meter comprising:

a graphic user interface connected with the revenue meter, said graphic user interface being operative to display scalable alphanumeric and graphical objects;

a meter cover operative to enclose the revenue meter and said graphic user interface, said meter cover further operative to be sealed to prevent removal of said meter cover and indicate tampering with said revenue meter; and a context adaptable input device located on said meter cover and connected with the revenue meter, said context adaptable input device being operative to interact with said graphic user interface without removing said meter cover.

2. The revenue meter according to claim 1 wherein said context adaptable input device comprises a keypad.

3. The revenue meter according to claim 2, further including intermediate actuators to mechanically connect said keypad with said graphic user interface of the revenue meter.

4. The revenue meter according to claim 2, wherein said keypad further includes a web portion which allows a plunger of said keypad to move in a direction generally perpendicular to said keypad.

5. The revenue meter according to claim 4 wherein the keypad is elastic.

6. The revenue meter according to claim 2, further including a compression plate operative to compress said keypad to said meter cover, to provide a water tight seal.

7. The revenue meter according to claim 6, wherein said compression plate includes a locating portion operative to align said keypad to at least one intermediate actuator, said at least one immediate actuator operative to mechanically connect said keypad with said graphic user interface of the revenue meter.

8. The revenue meter according to claim 2 wherein said keypad comprises keypad buttons.

9. The revenue meter according to claim 2 wherein said meter cover includes alignment means for aligning said context adaptable input device to intermediate actuators, said immediate actuators operative to mechanically connect said keypad with said graphic user interface of the revenue meter.

10. The revenue meter according to claim 9 wherein said alignment means comprises a compression plate with a locating portion.

11. The revenue meter according to claim 1 wherein said context adaptable input device comprises a touch screen.

12. The revenue meter according to claim 1 wherein said context adaptable input device comprises a mouse.

13. The revenue meter according to claim 1 wherein said context adaptable input device comprises a track ball.

14. The revenue meter according to claim 1 wherein said context adaptable input device comprises a light pen.

15. The revenue meter according to claim 1 wherein said context adaptable input device comprises a membrane switch.

16. The revenue meter according to claim 1 wherein said context adaptable input device comprises a joystick.

17. The revenue meter according to claim 1 wherein said context adaptable input device comprises a dial.

18. The revenue meter according to claim 1 wherein the revenue meter is programmed to scroll through a series of preset displays and wherein a user may use said context adaptable input device to interrupt said scrolling.

19. The revenue meter according to claim 18 wherein said revenue meter is programmed such that said user can scroll through one or more previously displayed screens in the revenue meter using said context adaptable input device.

20. The revenue meter according to claim 1, further comprising:
bayonet terminals disposed on the revenue meter mateable with matching jaws of a detachable meter mounting device; and
a seal connected between the revenue meter and said detachable meter mounting device, said seal operative to prevent removal of the revenue meter and indicate tampering with the revenue meter.

21. The revenue meter according to claim 1, further comprising:
terminals disposed on a bottom side of the revenue meter for coupling the revenue meter with the electric circuit;
a terminal cover for covering said terminals; and
a first seal connected with said meter cover and operative to prevent removal of said meter cover.

22. The revenue meter according to claim 1, further comprising:
a draw-out chassis coupled with the revenue meter and operative to fit within a switchboard enclosure;
terminals disposed on said draw-out chassis for engaging matching terminals within said switchboard enclosure; and
a seal connected with said meter cover and operative to prevent removal of said meter cover and indicate tampering with the revenue meter.

23. The revenue meter according to claim 1 wherein the graphic user interface displays at least one of a scalable text, a rectangle and a chart.

24. A revenue meter for measuring the delivery of electrical energy from an energy supplier to a consumer through an electric circuit, the revenue meter comprising:

a graphic user interface connected with the revenue meter, said graphic user interface operative to display scalable alphanumeric objects;

a meter cover operative to enclose the revenue meter and said graphic user interface, said meter cover further operative to be sealed to prevent removal of said meter cover and indicate tampering with said revenue meter; and a keypad located on said meter cover and connected with the revenue meter, said keypad being operative to interact with said graphic user interface without removing said meter cover.

25. The revenue meter according to claim 24, wherein said keypad further includes a web portion which allows a plunger of said keypad to move in a direction generally perpendicular to said keypad.

26. The revenue meter according to claim 24, further including intermediate actuators to mechanically connect said keypad with said graphic user interface of the revenue meter.

27. The revenue meter according to claim 26 wherein the keypad is elastic.

28. The revenue meter according to claim 26, further including a compression plate, said compression plate including a locating portion operative to align said keypad to said intermediate actuators.

29. The revenue meter according to claim 24, further including a compression plate operative to compress said keypad to said meter cover and further operative to provide a water tight seal.

30. The revenue meter according to claim 24, further comprising:
bayonet terminals disposed on the revenue meter mateable with matching jaws of a detachable meter mounting device; and
a seal connected between the revenue meter and said detachable meter mounting device, said seal operative to prevent removal of the revenue meter and indicate tampering with the revenue meter.

31. The revenue meter according to claim 24, further comprising:
terminals disposed on a bottom side of the revenue meter for coupling the revenue meter with the electric circuit;
a terminal cover for covering said terminals; and
a first seal connected with said meter cover and operative to prevent removal of said meter cover.

32. The revenue meter according to claim 24, further comprising:
a draw-out chassis coupled with the revenue meter and operative to fit within a switchboard enclosure;
terminals disposed on said draw-out chassis for engaging matching terminals within said switchboard enclosure; and
a seal connected with said meter cover and operative to prevent removal of said meter cover and indicate tampering with the revenue meter.

33. The revenue meter according to claim 24 wherein the graphic user interface displays at least one of a scalable text, a rectangle and a chart.

\* \* \* \* \*